(12) United States Patent
Gu

(10) Patent No.: US 7,816,996 B2
(45) Date of Patent: Oct. 19, 2010

(54) NON-REFLECTIVE MPNT SWITCH

(76) Inventor: Zeji Gu, 16 Fairland St., Lexington, MA (US) 02421

( * ) Notice: Subject to any disclaimer, the term of this patent is extended or adjusted under 35 U.S.C. 154(b) by 177 days.

(21) Appl. No.: 12/316,044

(22) Filed: Dec. 9, 2008

(65) Prior Publication Data

US 2009/0153222 A1 Jun. 18, 2009

Related U.S. Application Data

(60) Provisional application No. 61/008,011, filed on Dec. 18, 2007.

(51) Int. Cl.
*H01P 1/10* (2006.01)
*H01P 1/15* (2006.01)

(52) U.S. Cl. ......................... 333/101; 333/103
(58) Field of Classification Search .................. 333/101, 333/103, 104, 105, 107, 262
See application file for complete search history.

(56) References Cited

U.S. PATENT DOCUMENTS

| | | | |
|---|---|---|---|
| 4,731,594 A | 3/1988 | Kumar | 333/103 |
| 4,983,865 A | 1/1991 | Ho et al. | 307/571 |
| 5,446,424 A | 8/1995 | Pierro | 333/104 |
| 5,465,087 A | 11/1995 | Cooperman et al. | 340/825.8 |
| 5,642,083 A | 6/1997 | Kato et al. | 333/103 |
| 5,812,939 A | 9/1998 | Kohama | 455/78 |
| 5,933,122 A | 8/1999 | Sauer et al. | 343/876 |
| 5,991,607 A | 11/1999 | Burdenski et al. | 455/83 |
| 6,265,953 B1 | 7/2001 | Romano | 333/101 |
| 6,496,082 B1 | 12/2002 | DiPiazza | 333/101 |
| 6,737,933 B2 | 5/2004 | Nyberg | 333/81 R |
| 6,774,701 B1 | 8/2004 | Heston et al. | 327/408 |
| 7,079,816 B2 | 7/2006 | Khorram et al. | 455/78 |
| 7,138,846 B2 | 11/2006 | Suwa et al. | 327/308 |
| 7,307,490 B2 | 12/2007 | Kizuki et al. | 333/101 |
| 7,719,383 B2 * | 5/2010 | Gu | 333/101 |
| 2009/0058553 A1 * | 3/2009 | Gu | 333/101 |

* cited by examiner

*Primary Examiner*—Dean O Takaoka
(74) *Attorney, Agent, or Firm*—Joyce E. Lauer

(57) ABSTRACT

A non-reflective ring topology MPNT switching device comprises at least two poles, at least four throws, plural main switches, and plural bridge switches. The bridge switches enable all throws to be non-reflective throughout a wide frequency range. Each main switch is connected between one of the poles and one of the throws. Each bridge switch is connected between two of the throws, and each throw is connected to at least M+1 of the bridge switches, M being the pole count. In operation, each of M of the main switches has a first (ON) state and is connected to one of M active throws. For each active throw, each bridge switch connected to the active throw has a second (OFF) state. For each non-active throw, one bridge switch connected to the non-active throw has the first (ON) state and each other connected bridge switch has the second (OFF) state.

21 Claims, 14 Drawing Sheets

US 7,816,996 B2

NON-REFLECTIVE MPNT SWITCH

CROSS-REFERENCE TO RELATED APPLICATIONS

The present application claims the benefit of U.S. Provisional Application No. 61/008,011, filed Dec. 18, 2007. The above-referenced application is incorporated by reference herein.

BACKGROUND

Electronic multiple pole multiple throw (MPNT) switches are widely used. An MPNT switch is a switch having M poles ("P") and N throws ("T"), where M>1 and N>1. A pole and a throw are coupled to one another by a pole-throw signal path that includes at least one switching element such as a transistor. An electrical signal is routed on a signal path between one of the M poles and one of the N throws when that pole-throw signal path is in a conductive state.

In a single transmission mode MPNT switch, only a single pole-throw signal path is conductive at one time. In a multiple transmission mode MPNT switch, more than one pole-throw signal path may be conductive at the same time. A multiple transmission mode MPNT switch may be used in a communication device that operates in multiple input multiple output (MIMO) mode. In an MPNT antenna switch operating in MIMO mode, two or more paths are conductive at the same time, thereby enabling two or more antennas to transmit or receive signals at the same time.

The poles and throws that are in conductive signal paths may have good impedance matching, resulting in minimal signal reflection and a low voltage stopping wave ratio (VSWR). The poles and throws that are in non-conductive signal paths may have unmatched impedances, resulting in high reflection and high VSWR. For some switch applications it may be useful to have good impedance matching and low reflection in most or all of the signal paths, including the signal paths that are non-conductive. A switch with these characteristics is called a non-reflective (or absorptive or terminated) switch.

SUMMARY

A non-reflective ring topology MPNT switching device comprises at least two poles, at least four throws, plural main switches, and plural bridge switches. The bridge switches enable all throws to be non-reflective throughout a wide frequency range. Each main switch is connected between one of the poles and one of the throws. Each bridge switch is connected between two of the throws, and each throw is connected to at least M+1 of the bridge switches, M being the pole count. In operation, each of M of the main switches has a first (ON) state and is connected to one of M active throws. For each active throw, each bridge switch connected to the active throw has a second (OFF) state. For each non-active throw, one bridge switch connected to the non-active throw has the first (ON) state and each other connected bridge switch has the second (OFF) state.

Additional embodiments are described in the detailed description below. This summary does not purport to define the invention. The invention is defined by the claims.

DETAILED DESCRIPTION

Reference will now be made in detail to some embodiments, examples of which are illustrated in the accompanying drawings. In this description and in the appended claims, the terms 'a' or 'an' are used, as is common in patent documents, to include one or more than one. In this description and in the appended claims, the term 'or' is used to refer to a nonexclusive or, unless otherwise indicated.

Figure 1:
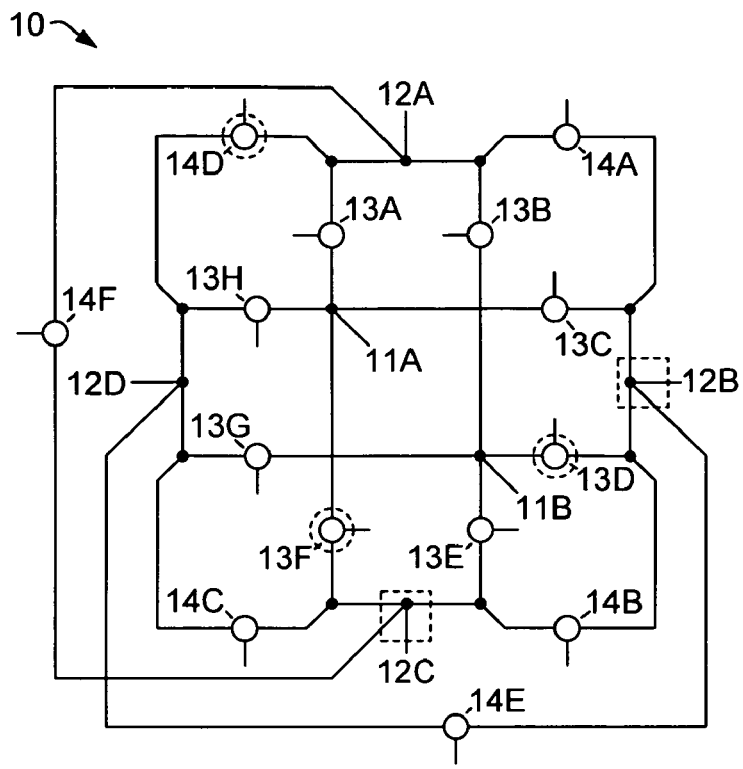
FIG. 1 depicts a non-reflective 2P4T switching device comprising two poles, four throws, eight main switches, and six bridge switches.

FIG. 1 depicts a non-reflective 2P4T (also called DP4T) switching device 10 comprising two poles 11, four throws 12, eight main switches 13, and six bridge switches 14, in accordance with an embodiment. In the embodiment of FIG. 1, the pole count M (number of poles 11) is two and the throw count N (number of throws 12) is four. The main switch count (number of main switches 13) is eight; the main switch count equals the pole count M multiplied by the throw count N. Each main switch 13 is connected between one of the poles 11 and one of the throws 12. For example, main switch 13B is connected between pole 11B and throw 12A. Each of the poles 11 is operably coupled to each of the throws 12 through one of the main switches 13. For example, pole 11A is operably coupled to throws 12A, 12B, 12C, and 12D through main switches 13A, 13C, 13F, and 13H, respectively.

The 2P4T switching device 10 has a ring topology. The simplest example of a ring topology MPNT switching device is a 2P2T switching device such as that described in U.S. Pat. No. 5,812,939. In an MPNT switching device having a ring topology, each ring includes two poles 11 and two throws 12 and four main switches 13 and any conductors that link these elements. In the ring topology switching device 10 of FIG. 1, one ring includes poles 11A and 11B, throws 12A and 12B, and main switches 13A-D. Three other rings exist, each ring including poles 11A and 11B together with two of the throws 12 and four main switches 13.

Each bridge switch 14 is connected between two of the throws 12. For example, bridge switch 14C is connected between throw 12C and throw 12D. Similarly, bridge switch 14E is connected between throw 12B and throw 12D. Bridge switches 14A-D are basic bridge switches 14, and bridge switches 14E-F are augment bridge switches 14. A basic bridge switch 14 is a bridge switch 14 that is connected between two throws 12 that are adjacent to one another. For example, basic bridge switch 14A is connected between throws 12A and 12B which are adjacent to one another. An augment bridge switch 14 is a bridge switch 14 that is connected between two throws 12 that are not adjacent to one another. For example, augment bridge switch 14F is connected between throws 12A and 12C which are not adjacent to one another.

In this description and in the appended claims, the adjectives "main" and "bridge" are used to indicate the locations of switches, and these adjectives do not imply any special attributes for a main switch 13 or a bridge switch 14. A main switch 13 is a switch that is connected between a pole 11 and a throw 12, and a bridge switch 14 is a switch that is connected between two throws 12. As described below in connection with FIGS. 13-15, an individual main switch 13 or bridge switch 14 may be realized using plural switching elements and other circuit elements. In this description and in the appended claims, a statement that a specific main switch 13 or a specific bridge switch 14 is "coupled to" or "connected to" a specific pole 11 or a specific throw 12 means that no other main switch 13, bridge switch 14, pole 11, or throw 12 is positioned between the specific main switch 13 or the specific bridge switch 14 and the specific pole 11 or the specific throw 12; the specific main switch 13 or specific bridge switch 14 may be coupled to the specific pole 11 or specific throw 12 through a circuit element such as a capacitor.

Operation of the switching device 10 is as follows. In the 2P4T switching device 10 of FIG. 1, a signal path between a pole 11 and a throw 12, or between two throws 12, may be in a conductive (ON) or non-conductive (OFF) state. The pole count M equals two, so there can be two conductive pole-throw signal paths at a given time, each conductive pole-throw signal path including one of the two poles 11. Only two of the four throws 12 can be in a conductive pole-throw signal path at a given time. The state of each pole-throw signal path (conductive or non-conductive) is determined by the state of the main switch 13 within the pole-throw signal path. Similarly, the state of each throw-throw signal path is determined by the state of the bridge switch 14 within the throw-throw signal path.

FIG. 1 also depicts a device state for switching device 10, the device state corresponding to a set of states for the main switches 13 and the bridge switches 14 in the switching device 10. Each main switch 13 or bridge switch 14 can have two states, a first state or a second state. The two states correspond to conductive (ON) and non-conductive (OFF) states for the pole-throw signal path that includes the main switch 13 or for the throw-throw signal path that includes the bridge switch 14. In the device state depicted in FIG. 1, two main switches 13D and 13F each have the first state (dashed circle indicates first state), and each of the other main switches 13 has the second state (absence of dashed circle indicates second state). Each of the poles 11 is connected to a main switch 13 that has the first (ON) state. Thus, pole 11A is connected to main switch 13F, which is also connected to throw 12C. Similarly, pole 11B is connected to main switch 13D, which is also connected to throw 12B.

Throws 12C and 12B are active throws 12 (dashed rectangle indicates active throw). An active throw 12 is a throw 12 that is connected to a main switch 13 that has the first state. Similarly, an active pole 11 is a pole 11 that is connected to a main switch 13 that has the first state. In the embodiment of FIG. 1, every pole 11 is active and thus no dashed element is used to indicate active poles. A conductive pole-throw signal path includes an active pole 11, an active throw 12, and a main switch 13 that has the first state.

For each active throw 12, each of the bridge switches 14 that is connected to the active throw 12 has the second state. Thus, active throw 12B is connected to three bridge switches 14A, 14B, and 14E, each of which has the second state. Similarly, active throw 12C is connected to three bridge switches 14B, 14C, and 14F, each of which has the second state. For each non-active throw 12, one of the bridge switches 14 that is connected to the non-active throw 12 has the first state and each other bridge switch 14 that is connected to the non-active throw 12 has the second state. Thus, non-active throw 12A is connected to bridge switch 14D which has the first state, and non-active throw 12A is also connected to bridge switches 14A and 14F which have the second state. Similarly, non-active throw 12D is connected to bridge switch 14D which has the first state, and non-active throw 12D is also connected to bridge switches 14C and 14E which have the second state.

In the 2P4T switching device 10 of FIG. 1, poles 11A and 11B are each non-reflective. Each of the poles 11 is active, meaning that it is connected to a main switch 13 that has the first (ON) state. Each pole 11 is connected to four main switches 13, and only one of those four main switches 13 has the first (ON) state at a given time. The pole 11 is part of a circuit that has reasonably matched impedances, because of the single connected main switch 13 that is ON, resulting in minimal reflection for the pole 11.

For the throws 12, non-reflectivity results from coordination of the states of the bridge switches 14 and the main switches 13. An individual throw 12 is connected to five switches, two main switches 13 and three bridge switches 14. If a single one of those five switches is in the ON state, this creates a circuit with reasonably matched impedances, resulting in minimal reflection for the throw 12. If a throw 12 is an active throw 12, it is coupled to a pole 11 through a main switch 13 that is in the ON state, resulting in minimal reflection for both the pole 11 and the active throw 12. If a throw 12 is a non-active throw 12, it is coupled to one other non-active throw 12 through a bridge switch 14 that is in the ON state, resulting in minimal reflection. In other words, reflection may be minimized if each non-active throw 12 is paired with one other non-active throw 12 by coupling through a bridge switch 14 that is in the ON state.

TABLE 1

| | PATHS | | SWITCHES WITH | |
|---|---|---|---|---|
| | 11A | 11B | FIRST (ON) STATE | |
| | to | to | main | bridge |
| 1  | 12A | 12B | 13A | 13D | 14C |
| 2  | 12A | 12C | 13A | 13E | 14E |
| 3  | 12A | 12D | 13A | 13G | 14B |
| 4  | 12B | 12C | 13C | 13E | 14D |
| 5  | 12B | 12D | 13C | 13G | 14F |
| 6  | 12C | 12D | 13F | 13G | 14A |
| 7  | 12B | 12A | 13C | 13B | 14C |
| 8  | 12C | 12A | 13F | 13B | 14E |
| 9  | 12D | 12A | 13H | 13B | 14B |
| 10 | 12C | 12B | 13F | 13D | 14D |
| 11 | 12D | 12B | 13H | 13D | 14F |
| 12 | 12D | 12C | 13H | 13E | 14A |

The device state depicted in FIG. 1 represents a snapshot in time for the states of switches within switching device 10. At another time, a different device state may exist, with a different set of active throws 12. Table 1 indicates the twelve possible device states for the 2P4T switching device 10 of FIG. 1. Each row in Table 1 corresponds to a device state for the switching device 10. In Table 1, the set of columns labelled "PATHS" indicates which throw 12 is linked to which pole 11 via a conductive pole-throw signal path, each indicated throw 12 being an active throw 12. The columns labelled "main" and "bridge" indicate which mains switches 13 and bridge switches 14 have the first (ON) state. The device state depicted in FIG. 1 corresponds to row 10 in Table 1.

Figure 2:
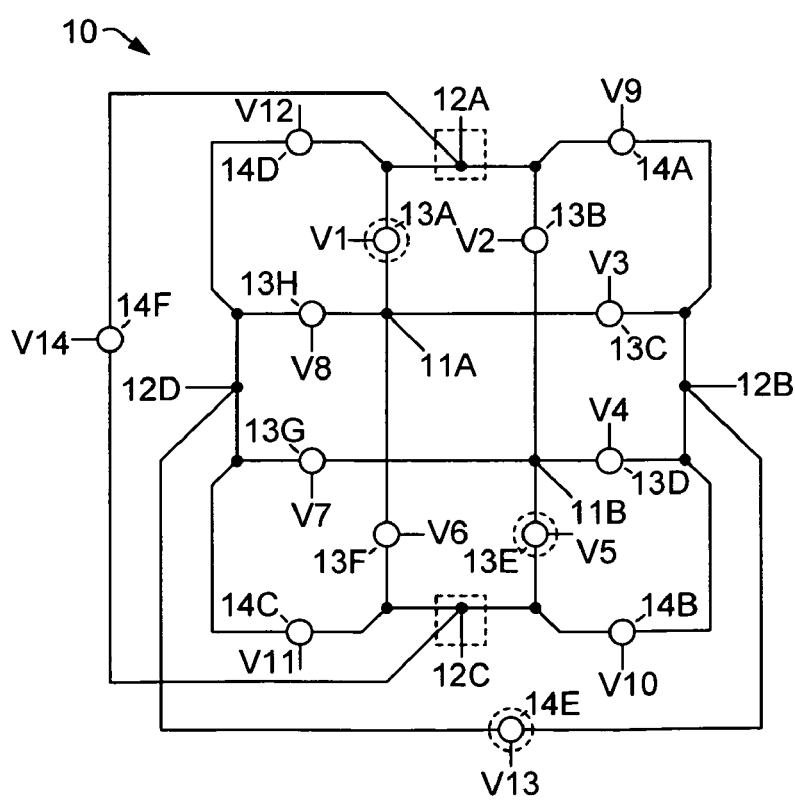
FIG. 2 depicts the 2P4T switching device of FIG. 1 with a pair of active throws that is different from the pair of active throws indicated in FIG. 1.

FIG. 2 depicts the 2P4T switching device 10 of FIG. 1 with a pair of active throws 12A, 12C that is different from the pair of active throws 12B, 12C indicated in FIG. 1. The device state depicted in FIG. 2 corresponds to row 2 in Table 1. The states of individual main switches 13 and bridge switches 14 within a non-reflective MPNT switching device 10 may be controlled using control signals. FIG. 2 indicates fourteen control signals V1-V14. Control signals V1-V8 control main switches 13A-13H. Control signals V9-V14 control bridge switches 14A-14F.

The twelve rows (device states) in Table 1 include two groups of six rows, rows 1-6 and rows 7-12. The active throws 12 in each of rows 1-6 are the same as the active throws 12 in each of rows 7-12, respectively, but the linkage of active throws 12 to poles 11 differs between rows 1-6 and rows 7-12. For example, in row 1 the linkages are 11A-12A and 11B-12B, whereas in row 7 the linkages are 11A-12B and 11B-12A. The term "basic group" is used here to refer to the six sets of active throws 12 that correspond to the active throws 12 in rows 1-6 or rows 7-12.

For a general MPNT switching device 10, the number of sets of active throws 12 in the basic group is determined as follows, using the 2P4T case as an example. A 2P4T switching device 10 has four throws 12, two of which can be active at a time. The number of possible combinations of X things taken Y at a time is given by the formula: $X!/(Y!(X-Y)!)$. For a switching device 10 with four throws 12, two of which can be active, $X=4$ and $Y=2$. Evaluating the formula with these values for X and Y, the number of possible combinations of four throws taken two at a time equals six. These six possible combinations of throws 12 correspond to the six sets of active throws 12 in rows 1-6 or rows 7-12.

As noted, the linkage of poles 11 to active throws 12 differs between rows 1-6 and rows 7-12. The basic group of six sets of active throws 12 appears twice, once for each of the poles 11. There are two poles 11 and there are six sets in the basic group, so the total number of rows (device states) in Table 1 is two multiplied by six which equals twelve. For a general MPNT switching device 10, the number of device states equals the pole count M (the number of poles 11) multiplied by the number of sets of active throws 12 in the basic group, which is determined using the formula in the previous paragraph.

The 2P4T switching device 10 of FIGS. 1 and 2 is one embodiment of an MPNT switching device 10 that uses bridge switches 14 to make the throws 12 non-reflective. In other embodiments, a non-reflective MPNT switching device 10 may have different numbers of poles 11 and throws 12. For one type of MPNT switching device 10, the throw count N is greater than the pole count M and the number of active throws 12 equals the pole count M, as in the embodiment of FIGS. 1 and 2. Another type of MPNT switching device 10, in which the number of active throws 12 is less than the pole count M, is described in connection with FIGS. 10-12.

If non-active throws 12 are to be paired with one another through a bridge switch 14, there should be an even number of non-active throws 12. For a switching device 10 in which the number of active throws 12 is the same as the pole count M, the number of non-active throws 12 equals the throw count N minus the pole count M. To enable pairing of non-active throws 12, the difference between the throw count N and the pole count M should equal an even integer that is greater than or equal to two. In the embodiment of FIG. 1, N minus M equals four minus two which equals two, and this value is an even integer greater than or equal to two.

For a general MPNT switching device 10 having M poles and N throws, how many bridge switches 14 should be connected to each throw 12 in order to ensure non-reflectivity? Consider the case where a first throw 12 is connected to M bridge switches 14, each of which is connected to one other throw 12, resulting in M other throws 12 that are potential pairing partners for the first throw 12. In one device state, the first throw 12 is non-active and each of the M other throws 12 is active. In this device state there is a problem: no non-active throw 12 is available for pairing with the non-active first throw 12, because each of the potential pairing partners is an active throw 12. Therefore, a throw 12 should be connected to at least M+1 bridge switches 14 in order to ensure that the throw 12 can always find at least one non-active throw 12 that it can pair with.

Assuming that each throw 12 is connected to at least M+1 bridge switches 14, we can determine the minimum number of bridge switches 14 needed for a general MPNT switching device 10. There are N throws 12, and each throw 12 is connected to M+1 bridge switches 14. Also, each bridge switch 14 is connected to two throws 12. Thus, the bridge switch count B (the number of bridge switches 14) should be greater than or equal to $N(M+1)/2$.

The 2P4T switching device 10 of FIG. 1 conforms to the these recommendations about bridge switches 14. In this 2P4T switching device 10, M equals two so M+1 equals three. Each throw 12 is connected to three bridge switches 14. The bridge switch count B equals six: $N(M+1)/2=4(2+1)/2=6$.

Figure 3:
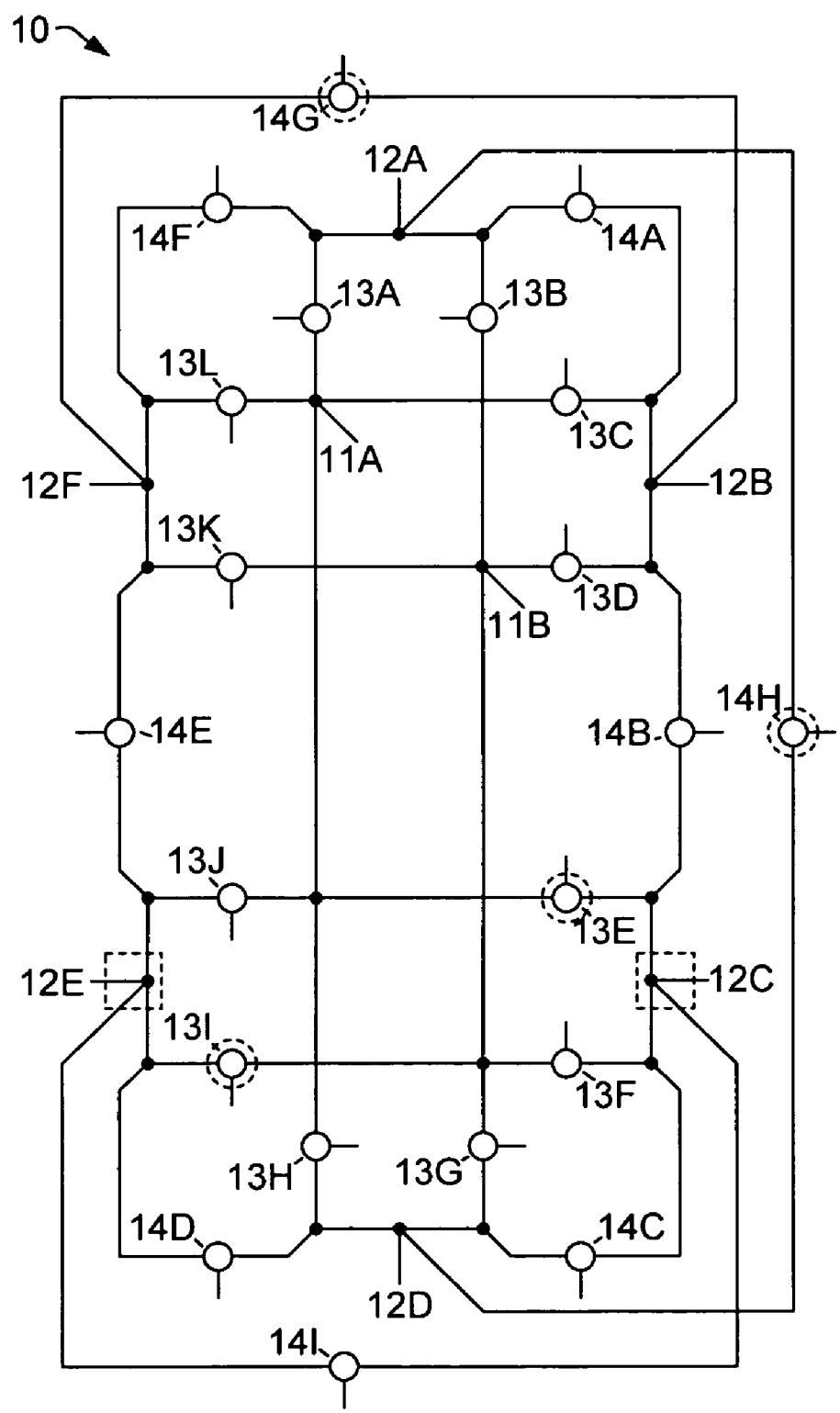
FIG. 3 depicts a non-reflective 2P6T switching device comprising two poles, six throws, twelve main switches, and nine bridge switches.

FIG. 3 depicts a non-reflective 2P6T switching device 10 comprising two poles 11, six throws 12, twelve main switches 13, and nine bridge switches 14, in accordance with an embodiment. The 2P6T switching device 10 of FIG. 3 is very similar to the 2P4T switching device 10 of FIGS. 1-2. In the 2P6T switching device 10 of FIG. 3, bridge switches 14A-F are basic bridge switches 14, and bridge switches 14G-I are augment bridge switches 14. M equals two so M+1 equals three, and each throw 12 is connected to three bridge switches 14. The bridge switch count B equals nine: N(M+1)/2=6(2+1)/2=9.

TABLE 2

| | PATHS | | SWITCHES WITH | |
|---|---|---|---|---|
| | 11A | 11B | FIRST (ON) STATE | |
| | to | to | main | bridge |
| 1 | 12A | 12B | 13A | 13D | 14C | 14E |
| 2 | 12A | 12C | 13A | 13F | 14G | 14D |
| 3 | 12A | 12D | 13A | 13G | 14B | 14E |
| 4 | 12A | 12E | 13A | 13I | 14G | 14C |
| 5 | 12A | 12F | 13A | 13K | 14B | 14D |
| 6 | 12B | 12C | 13C | 13F | 14D | 14F |
| 7 | 12B | 12D | 13C | 13G | 14I | 14F |
| 8 | 12B | 12E | 13C | 13I | 14C | 14F |
| 9 | 12B | 12F | 13C | 13K | 14H | 14I |
| 10 | 12C | 12D | 13E | 13G | 14A | 14E |
| 11 | 12C | 12E | 13E | 13I | 14H | 14G |
| 12 | 12C | 12F | 13E | 13K | 14A | 14D |
| 13 | 12D | 12E | 13H | 13I | 14B | 14F |
| 14 | 12D | 12F | 13H | 13K | 14I | 14A |
| 15 | 12E | 12F | 13J | 13K | 14A | 14C |
| 16 | 12B | 12A | 13C | 13B | 14C | 14E |
| 17 | 12C | 12A | 13E | 13B | 14G | 14D |
| 18 | 12D | 12A | 13H | 13B | 14B | 14E |
| 19 | 12E | 12A | 13J | 13B | 14G | 14C |
| 20 | 12F | 12A | 13L | 13B | 14B | 14D |
| 21 | 12C | 12B | 13E | 13D | 14D | 14F |
| 22 | 12D | 12B | 13H | 13D | 14I | 14F |
| 23 | 12E | 12B | 13J | 13D | 14C | 14F |
| 24 | 12F | 12B | 13L | 13D | 14H | 14I |
| 25 | 12D | 12C | 13H | 13F | 14A | 14E |
| 26 | 12E | 12C | 13J | 13F | 14H | 14G |
| 27 | 12F | 12C | 13L | 13F | 14A | 14D |
| 28 | 12E | 12D | 13J | 13G | 14B | 14F |
| 29 | 12F | 12D | 13L | 13G | 14I | 14A |
| 30 | 12F | 12E | 13L | 13I | 14A | 14C |

Table 2 indicates the thirty possible device states for the 2P6T switching device 10 of FIG. 3. Within Table 2, the number of sets of active throws 12 in the basic group is fifteen. There are two poles 11 and there are fifteen sets in the basic group, so the total number of rows (device states) in Table 2 is two multiplied by fifteen which equals thirty. The device state depicted in FIG. 3 corresponds to row 11 in Table 2.

Figure 4:
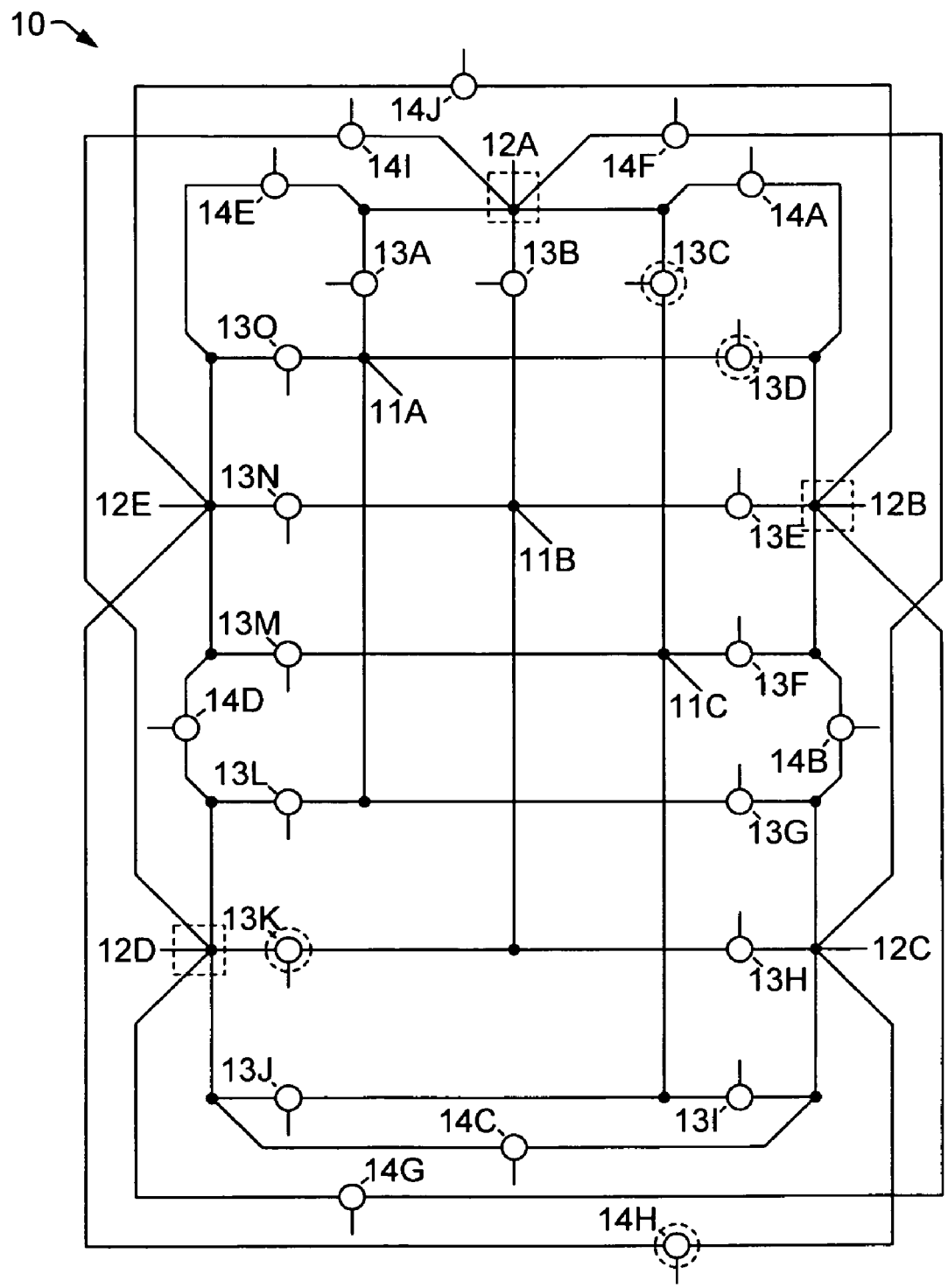
FIG. 4 depicts a non-reflective 3P5T switching device comprising three poles, five throws, fifteen main switches, and ten bridge switches.

FIG. 4 depicts a non-reflective 3P5T switching device 10 comprising three poles 11, five throws 12, fifteen main switches 13, and ten bridge switches 14, in accordance with an embodiment. The 3P5T switching device 10 of FIG. 4 is very similar to the embodiments depicted in FIGS. 1-3. In the 3P5T switching device 10 of FIG. 4, bridge switches 14A-E are basic bridge switches 14, and bridge switches 14F-J are augment bridge switches 14. M equals three so M+1 equals four, and each throw 12 is connected to four bridge switches 14. The bridge switch count B equals ten: N(M+1)/2=5(3+1)/2=10.

There are thirty possible device states for the 3P5T switching device 10 of FIG. 4. The number of sets of active throws 12 in the basic group is ten. This value is calculated using the formula described in connection with Table 1: X!/(Y!(X−Y)!)=5!/(3!(2)!)=5×4/2=10.

The total number of device states=M×10=3×10=30. In the device state depicted in FIG. 4, throws 12A, 12B, and 12D are active throws 12. Non-active throws 12C and 12E are connected to bridge switch 14H which has the first (ON) state.

Figure 5:
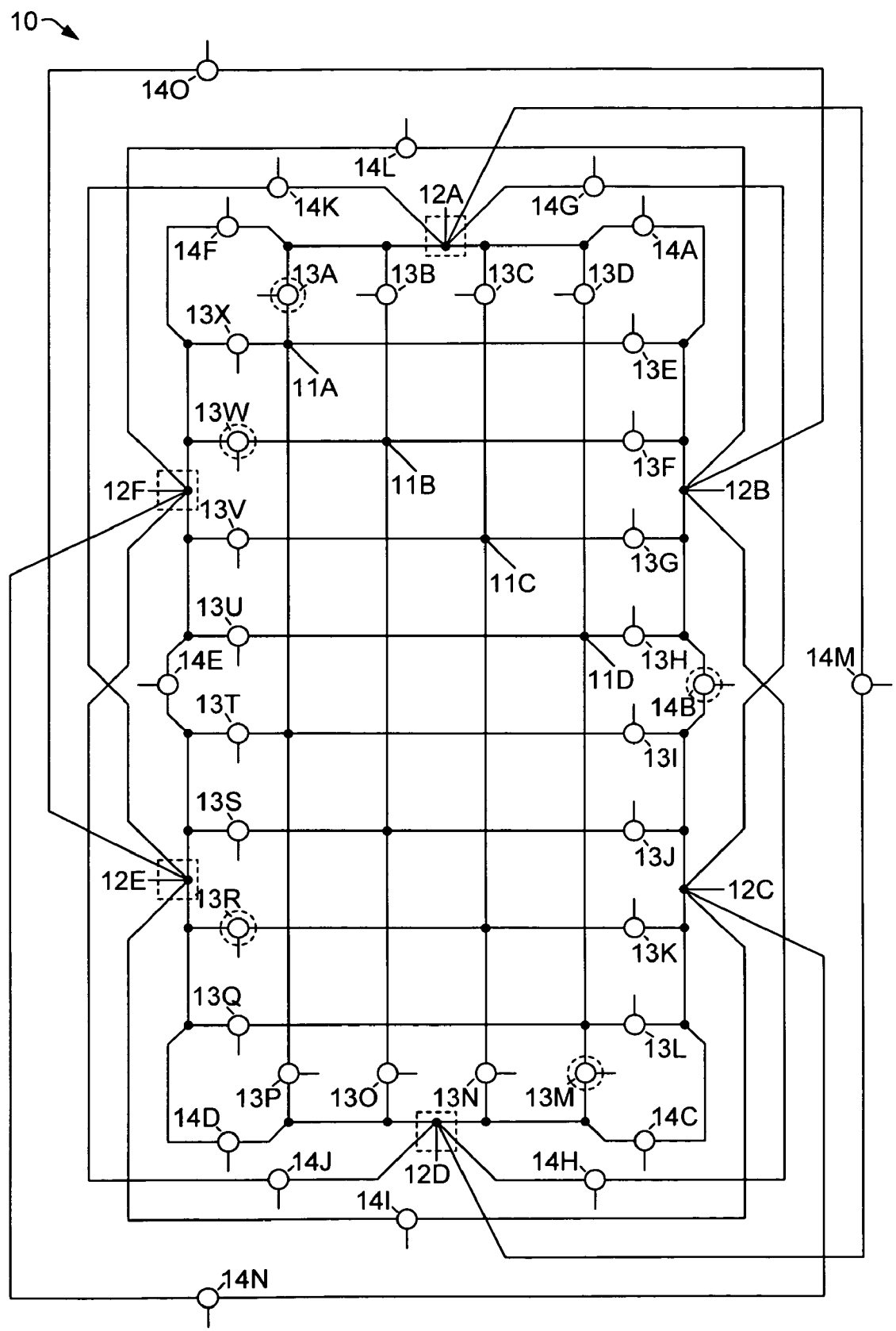
FIG. 5 depicts a non-reflective 4P6T switching device comprising four poles, six throws, twenty-four main switches, and fifteen bridge switches.

FIG. 5 depicts a non-reflective 4P6T switching device 10 comprising four poles 11, six throws 12, twenty-four main switches 13, and fifteen bridge switches 14, in accordance with an embodiment. The 4P6T switching device 10 of FIG. 5 is very similar to the embodiments depicted in FIGS. 1-4. In the switching device 10 of FIG. 5, bridge switches 14A-F are basic bridge switches 14, and bridge switches 14G-O are augment bridge switches 14. M equals four so M+1 equals five, and each throw 12 is connected to five bridge switches 14. The bridge switch count B equals fifteen: N(M+1)/2=6(4+1)/2=15.

There are sixty possible device states for the 4P6T switching device 10 of FIG. 5. The number of sets of active throws 12 in the basic group is fifteen. This value is calculated using the formula described in connection with Table 1: X!/(Y!(X−Y)!)=6!/(4!(2)!)=6×5/2=15.

The total number of device states=M×15=4×15=60. In the device state depicted in FIG. 5, throws 12A, 12D, 12E, and 12F are active throws 12. Non-active throws 12B and 12C are connected to bridge switch 14B which has the first (ON) state.

Table 3 summarizes information about the MPNT switching devices 10 depicted in FIGS. 1-5. Similar embodiments having a greater pole count M and a greater throw count N are possible, as long as the difference N minus M is an even integer that is greater than or equal to two.

TABLE 3

| MPNT | 2P4T | 2P6T | 3P5T | 4P6T |
|---|---|---|---|---|
| main switches | 8 | 12 | 15 | 24 |
| M + 1 | 3 | 3 | 4 | 5 |
| bridge switches | 6 | 9 | 10 | 15 |
| basic | 4 | 6 | 5 | 6 |
| augment | 2 | 3 | 5 | 9 |
| device states | 12 | 30 | 30 | 60 |
| N minus M | 2 | 4 | 2 | 2 |

For some embodiments, there may be more than one way to position the M+1 bridge switches 14 for each throw 12 and the B bridge switches 14 for the entire switching device 10. The flexibility of positioning for bridge switches 14 depends upon the value of the difference N minus M.

In a switching device 10 for which the difference N minus M equals two, there is no flexibility in positioning of the bridge switches 14. For example, in a 3P5T switching device 10, N minus M equals 5 minus 3 which equals 2. So M=N−2. The number of bridge switches 14 connected to each throw 12 is at least M+1, and by substitution M+1=(N−2)+1=N−1. Thus, each throw 12 is linked to N−1 other throws 12 via N−1 bridge switches 14. But there are only N throws 12 total, including the throw 12 of interest, so linkage to N−1 other throws 12 implies linkage to every other throw 12. In other words, there is only a single valid solution, in which each throw 12 links to every other throw 12, so there is no flexibility in positioning of bridge switches 14.

In contrast, in a switching device 10 for which the difference N minus M is greater than or equal to four, there is more than one way to position the bridge switches 14. For example, in a 2P6T switching device 10, N minus M equals 6 minus 2 which equals 4. So M=N−4. The number of bridge switches 14 connected to each throw 12 is at least M+1, and by substitution M+1=(N−4)+1=N−3. For a 2P6T switching device 10, N−3=6−3=3. Thus each throw 12 is linked to 3 other throws 12 via 3 bridge switches 14. The throw 12 of interest need not be linked to every other throw 12; it needs to link to only 3 of the other 5 throws 12. As a result, there is flexibility in positioning of the bridge switches 14, and alternative positionings are possible.

In the 2P6T embodiment depicted in FIG. 3, each throw 12 is connected to two basic bridge switches 14 and one augment bridge switch 14. There are three augment bridge switches 14, each of which links a pair of throws 12. In the embodiment of FIG. 3, the augment bridge switches 14 link the following pairs of throws 12: 12A-12D, 12C-12E, and 12F-12B. In alternative embodiments, the six throws 12 may be linked by three augment bridge switches 14 using alternative pairings. In a first alternative, the throws 12 are linked as follows: 12A-12E, 12B-12D, and 12C-12F. In a second alternative, the throws 12 are linked as follows: 12A-12C, 12B-12E, and 12D-12

In the embodiments of FIG. 1-5, each throw is connected to M+1 bridge switches 14 that include two basic bridge switches 14 and one or more augment bridge switches 14. In embodiments for which the difference N minus M is greater than or equal to four, a throw 12 may be connected to different numbers of basic bridge switches 14 and augment bridge switches 14. As noted in connection with FIG. 1, a basic bridge switch 14 is connected between two throws 12 that are adjacent to one another. An individual throw 12 is adjacent to two other throws 12, so the maximum possible number of basic bridge switches 14 connected to a throw 12 is two. For non-reflectivity, the total number of bridge switches 14 connected to a throw 12 is at least M+1, and those M+1 bridge switches 14 may include two or one or zero basic bridge switches 14, the balance being augment bridge switches 14. Three cases are possible: two basic bridge switches 14 plus at least M−1 augment bridge switches 14; one basic bridge switch 14 plus at least M augment bridge switches 14; and zero basic bridge switches 14 plus at least M+1 augment bridge switches 14.

Figure 6:
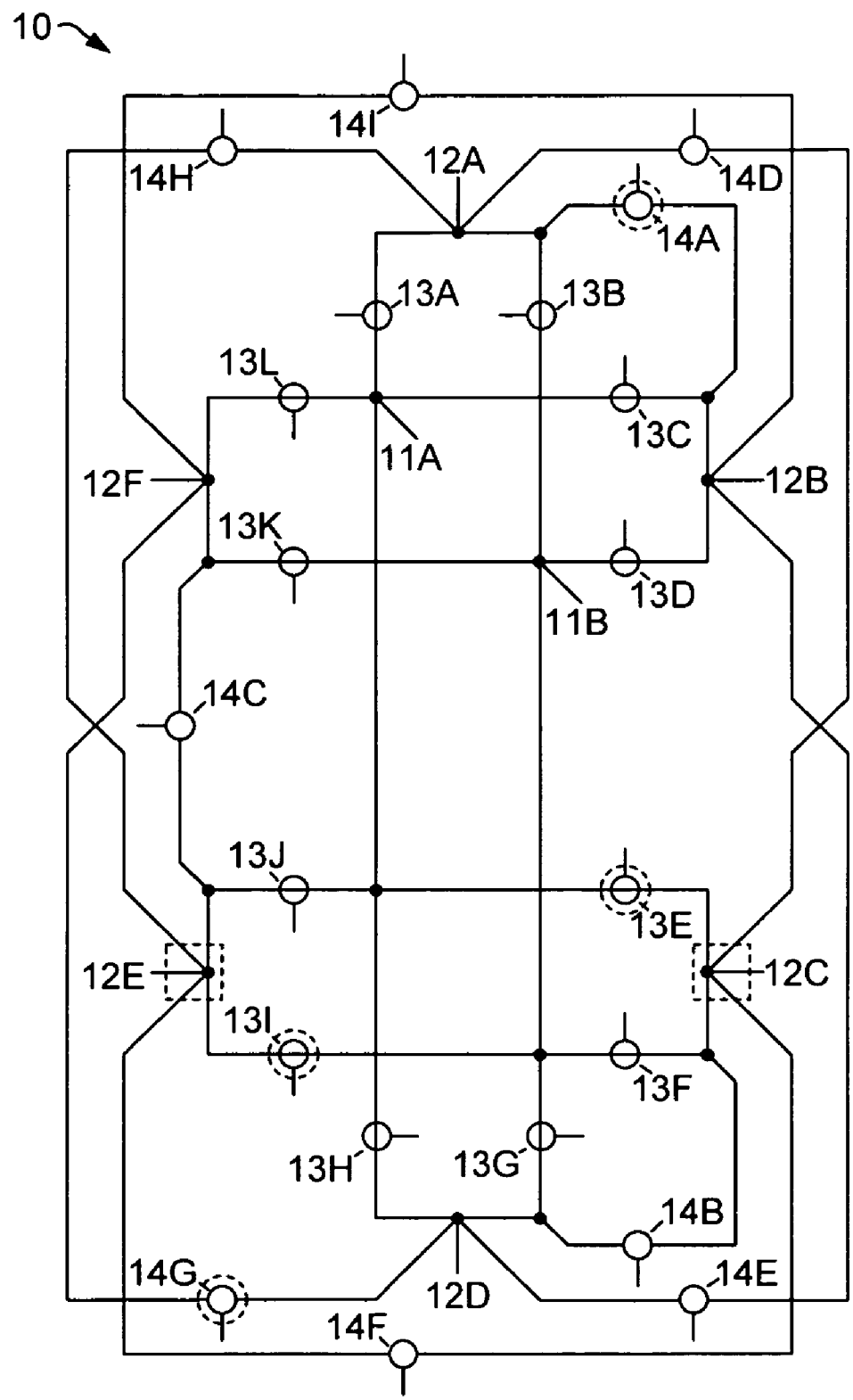
FIG. 6 depicts a non-reflective 2P6T switching device in which for each throw the three bridge switches that are connected to the throw include one basic bridge switch and two augment bridge switches.
Figure 7:
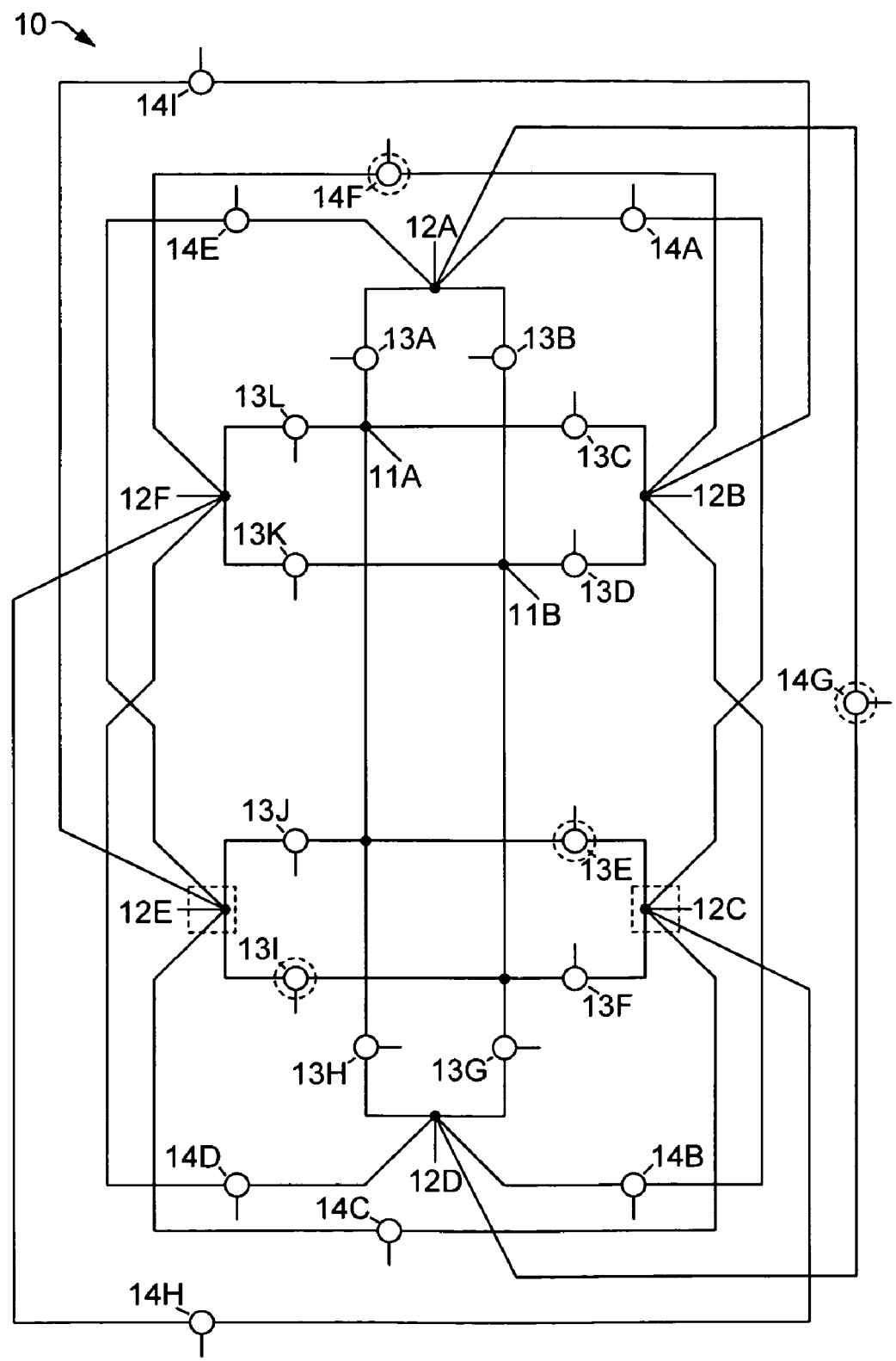
FIG. 7 depicts a non-reflective 2P6T switching device in which for each throw the three bridge switches that are connected to the throw include three augment bridge switches.
Figure 8:
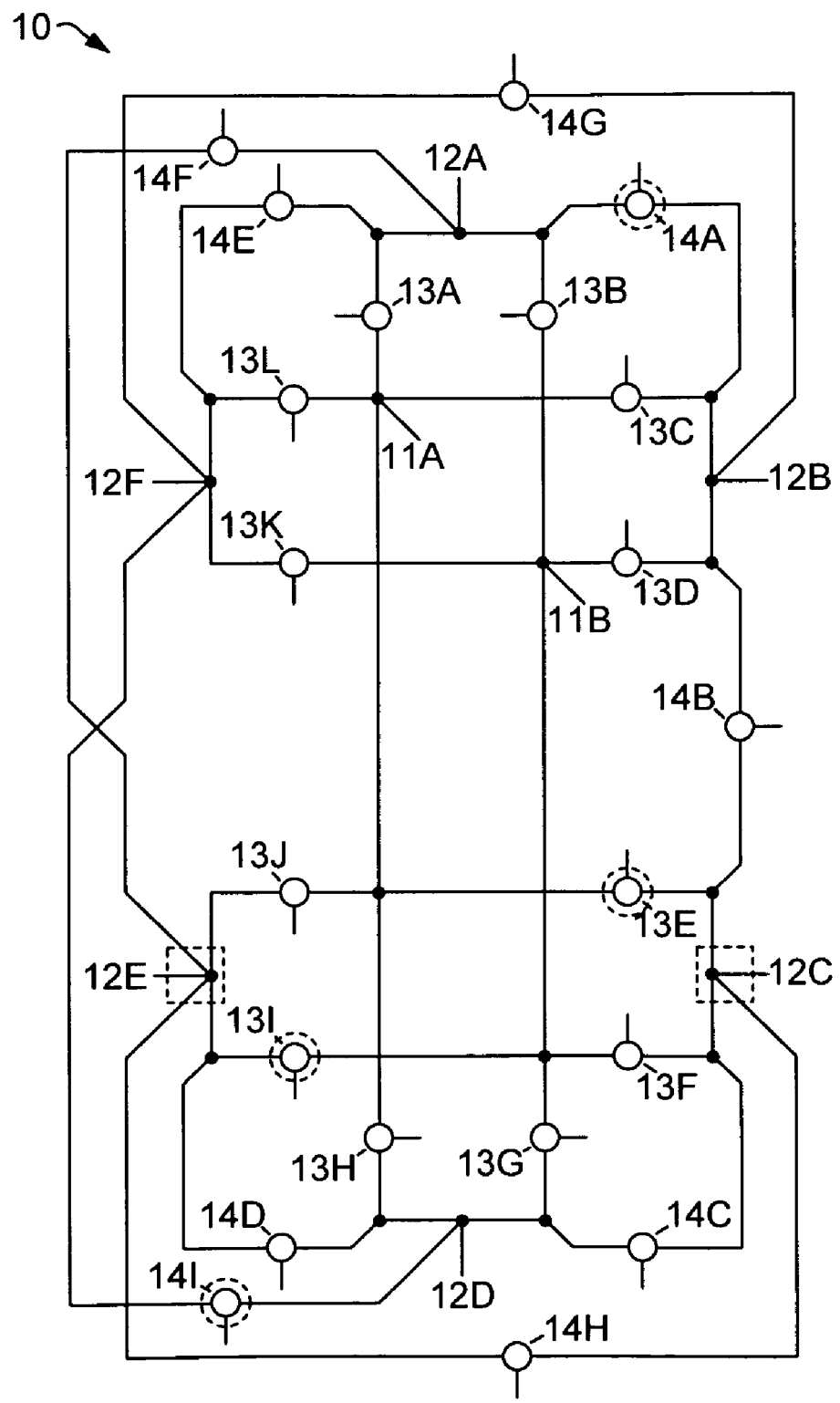
FIG. 8 depicts a non-reflective 2P6T switching device in which some of the throws are connected to a greater number of augment bridge switches and fewer basic bridge switches, compared to other throws.

In the 2P6T embodiment depicted in FIG. 3, each throw 12 is connected to two basic bridge switches 14 and one (ie M−1) augment bridge switch 14. 2P6T embodiments having fewer basic bridge switches 14 and a greater number of augment bridge switches 14 are depicted in FIGS. 6, 7, and 8. Similar embodiments are possible for other MPNT switching devices 10 in which N minus M is greater than or equal to four. Variation with respect to bridge switches 14 offers flexibility in design which may be advantageous; this topic is discussed further following the discussion of FIG. 8.

FIG. 6 depicts a non-reflective 2P6T switching device 10 in which for each throw 12 the three bridge switches 14 that are connected to the throw 12 include one basic bridge switch 14 and two (ie M) augment bridge switches 14, in accordance with an embodiment. As in the 2P6T embodiment of FIG. 3, the embodiment of FIG. 6 has twelve main switches 13 and nine bridge switches 14. Bridge switches 14A-C are basic bridge switches 14, and bridge switches 14D-I are augment bridge switches 14. In alternative embodiments, the six throws 12 may be linked by three basic bridge switches 14 and six augment bridge switches 14 using alternative pairings. In one alternative, for example, basic bridge switches 14 could link the following pairs of throws: 12B-12C, 12D-12E, and 12F-12A. In the device state depicted in FIG. 6, throws 12C and 12E are active throws 12. Non-active throws 12A, 12B, 12D and 12F are connected to bridge switches 14A and 14G which have the first (ON) state.

FIG. 7 depicts a non-reflective 2P6T switching device 10 in which for each throw 12 the three bridge switches 14 that are connected to the throw 12 include three (ie M+1) augment bridge switches 14, in accordance with an embodiment. As in the 2P6T embodiment of FIG. 3, the embodiment of FIG. 7 has twelve main switches 13 and nine bridge switches 14. There are no basic bridge switches 14, and all of the bridge switches 14A-I are augment bridge switches 14. In the device state depicted in FIG. 7, throws 12C and 12E are active throws 12. Non-active throws 12A, 12B, 12D and 12F are connected to bridge switches 14F and 14G which have the first (ON) state.

FIG. 8 depicts a non-reflective 2P6T switching device 10 in which some of the throws 12 are connected to a greater number of augment bridge switches 14 and fewer basic bridge switches 14, compared to other throws 12. Each of throws 12A-D is connected to two basic bridge switches 14 and one augment bridge switch 14; the augment bridge switch count equals one for throws 12A-D. Each of throws 12E-F, however, is connected to one basic bridge switch 14 and two augment bridge switches 14; the augment bridge switch count equals two for throws 12E-F. Thus, the augment bridge switch count differs for throws 12A-D and throws 12E-F. Many other embodiments are possible in which the augment bridge switch count differs for individual throws 12. Such embodiments offer flexibility in design. In the device state depicted in FIG. 8, throws 12C and 12E are active throws 12. Non-active throws 12A, 12B, 12D and 12F are connected to bridge switches 14A and 14I which have the first (ON) state.

Variation with respect to number and positioning of bridge switches 14 offers flexibility in design. This flexibility may be advantageous in terms of circuit layout, insertion loss, isolation, power handling, linearity, or other parameters. It may be advantageous to employ basic bridge switches 14 rather than augment bridge switches 14, for two reasons. First, when a pair of adjacent throws 12 is linked in a throw-throw signal path via a basic bridge switch 14, the throw-throw signal path need not cross any other throw-throw signal path. In contrast, when pairs of non-adjacent throws 12 are linked in throw-throw signal paths via augment bridge switches 14, those throw-throw signal paths cross one another. Secondly, a throw-throw signal path between adjacent throws 12 that includes a basic bridge switch 14 is generally shorter in length than a throw-throw signal path between non-adjacent throws 12 that includes an augment bridge switch 14. Augment bridge switches 14 may offer advantages in some situations, however. Additional embodiments that differ in number and position of bridge switches 14 are discussed in connection with FIGS. 16 and 17.

Figure 9:
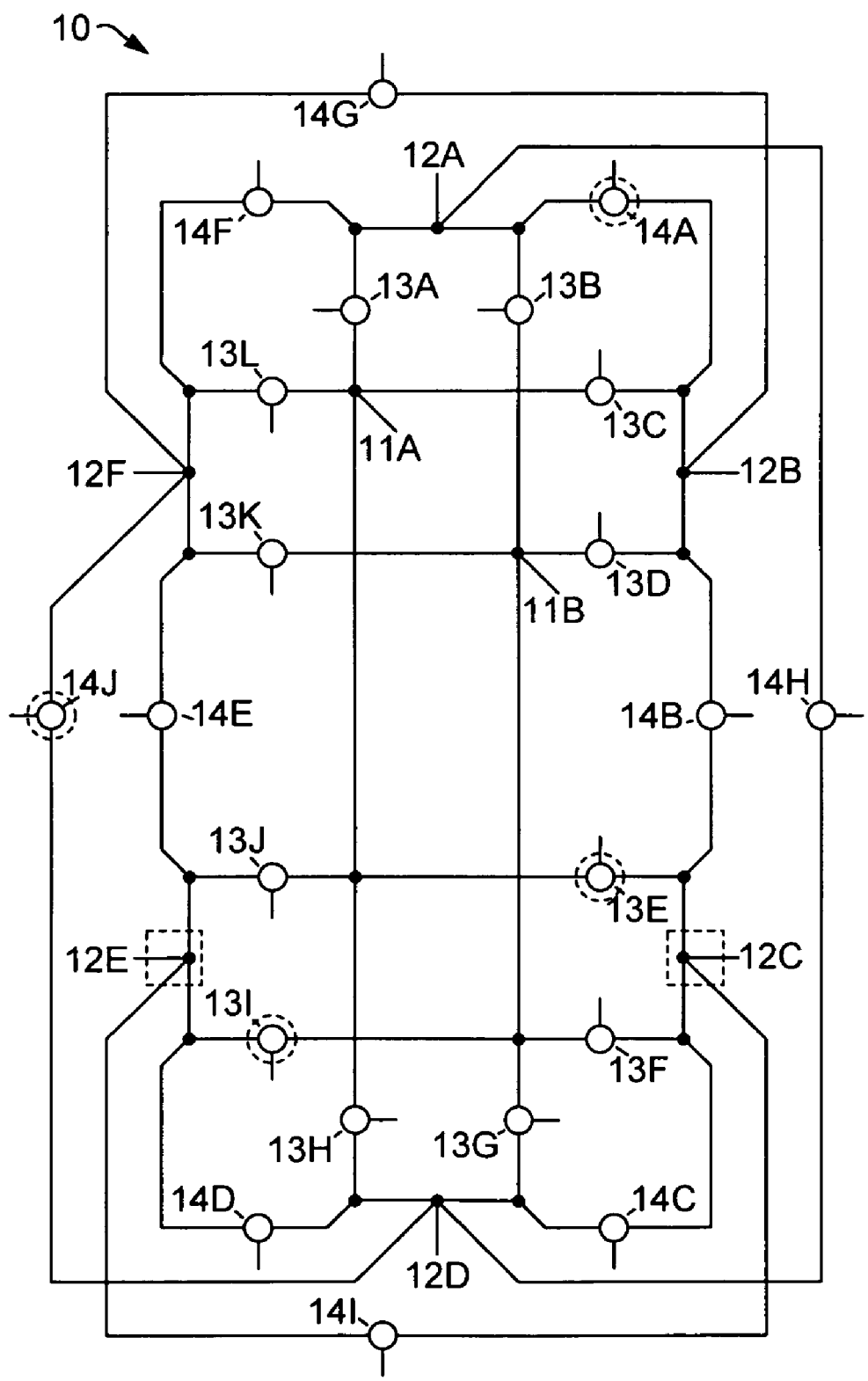
FIG. 9 depicts a non-reflective 2P6T switching device in which each of two of the throws is connected to four bridge switches and each other throw is connected to three bridge switches.

In the embodiments of FIGS. 1-8, the number of bridge switches 14 is the minimum number required for non-reflectivity of the throws 12. Thus, each throw 12 is connected to M+1 bridge switches 14, and the bridge switch count B (the total number of bridge switches 14) equals N(M+1)/2. The embodiment of FIG. 9, in contrast, has more than the minimum number of bridge switches 14 required for non-reflectivity. FIG. 9 depicts a non-reflective 2P6T switching device 10 in which each of two of the throws 12 is connected to four bridge switches 14 and each other throw 12 is connected to three bridge switches 14, in accordance with an embodiment. The embodiment of FIG. 9 is similar to that of FIG. 3, except for the addition of an additional bridge switch 14J that is connected to throws 12D and 12F. For a 2P6T switch, M+1=3. In the embodiment of FIG. 9, each of throws 12D and 12F is connected to greater than M+1 bridge switches 14. The total number of bridge switches 14 is ten, which is greater than the nine bridge switches 14 in the 2P6T embodiment of FIG. 3. In the device state depicted in FIG. 9, throws 12C and 12E are active throws 12. Non-active throws 12A, 12B, 12D and 12F are connected to bridge switches 14A and 14J which have the first (ON) state.

In the embodiments of FIGS. 1-9, each of the poles 11 is active when the switching device 10 is in use, the number of active throws 12 equals the pole count M, and bridge switches 14 enable non-active throws 12 to be non-reflective. In another type of MPNT switching device 10, described in connection with FIGS. 10-12, some of the poles 11 may be non-active, the same as for the throws 12. To minimize reflection for non-active poles 11 in this second type of switching device 10, each pole 11 is linked to other poles 11 via a second type of bridging switch called a pole bridge switch 16. The pole bridge switches 16 are similar to bridge switches 14, but each pole bridge switch 16 is connected between two of the poles 11 whereas each bridge switch 14 is connected between two of the throws 12.

Figure 10:
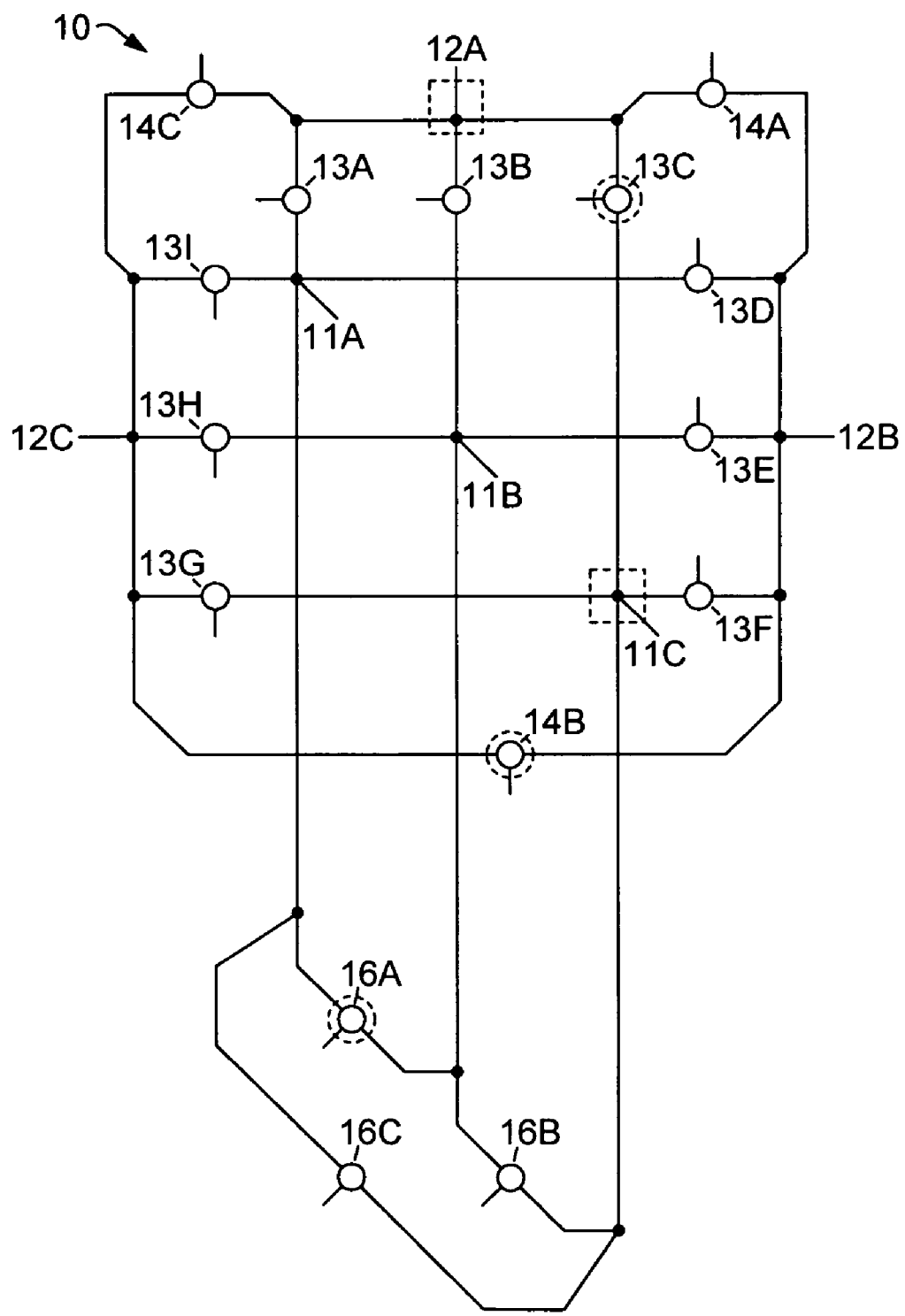
FIG. 10 depicts a non-reflective 3P3T switching device comprising three poles, three throws, nine main switches, three bridge switches, and three pole bridge switches.

FIG. 10 depicts a non-reflective 3P3T switching device 10 comprising three poles 11, three throws 12, nine main switches 13, three bridge switches 14, and three pole bridge switches 16, in accordance with an embodiment. The throw count N is three and is equal to the pole count M. The bridge switch count B is three and is equal to the throw count N. The pole bridge switch count P (the number of pole bridge switches 16) is three and is equal to the pole count M.

The 3P3T switching device 10 of FIG. 10 can operate in different modes, the mode depending upon the number of poles 11 and throws 12 that are active, which in turn depends upon the number of main switches 13 that are in the first (ON) state. In this description and in the appended claims, the term "A" means a count for the main switches 13 having the first (ON) state. If A of the main switches 13 are in the first (ON) state, then A of the poles 11 and A of the throws 12 are active (the term "A" is an abbreviation of the word "active"). In a first mode for the switching device 10 of FIG. 10, A equals one so one of the main switches 13 has the first (ON) state, one of the three poles 11 is active, and one of the three throws 12 is active. In a second mode, A equals three so three of the main switches 13 have the first (ON) state, all three of the poles 11 are active, and all three of the throws 12 are active. In the device state depicted in FIG. 10, pole 11C is active and throw 12A is active; this device state is an example of the first mode. Note that in FIGS. 10-12 active poles 11 are indicated by dashed rectangles, similar to active throws 12.

To enable pairing of non-active throws 12 via bridge switches 14, each throw 12 is connected to two of the bridge switches 14. Similarly, each pole 11 is connected to two of the pole bridge switches 16. In other embodiments, described in connection with FIGS. 11 and 12, each throw 12 and pole 11 may be connected to greater numbers of bridge switches 14 or pole bridge switches 16. To enable pairing of non-active poles 11 and for pairing of non-active throws 12, the difference between the throw count N and the pole count M should equal an even integer that is greater than or equal to zero. In the embodiment of FIG. 10, the difference N minus M equals zero.

To minimize reflectivity of non-active throws 12 and poles 11, the states of bridge switches 14 and pole bridge switches 16 are coordinated with the states of main switches 13, as described for bridge switches 14 in connection with FIG. 1. For each active pole 11, each of the pole bridge switches 16 that is connected to the active pole 11 has the second state. In the device state depicted in FIG. 10, active pole 11C is connected to two pole bridge switches 16B and 16C, each of which has the second state. For each non-active pole 11, one of the pole bridge switches 16 that is connected to the non-active pole 11 has the first state and each other pole bridge switch 16 that is connected to the non-active pole 11 has the second state. Thus, non-active pole 11A is connected to pole bridge switch 16A which has the first state, and non-active pole 11A is also connected to pole bridge switch 16C which has the second state. Similarly, non-active pole 11B is connected to pole bridge switch 16A which has the first state, and non-active pole 11B is also connected to pole bridge switch 16B which has the second state.

Table 4 indicates the nine possible device states for the 3P3T switching device 10 of FIG. 10 when operating in the first mode. The abbreviations "br" and "pobr" refer to bridge switches 14 and pole bridge switches 16 respectively. The device state depicted in FIG. 10 corresponds to row 7 in Table 4.

TABLE 4

| | PATHS | | | SWITCHES WITH FIRST (ON) STATE | | |
|---|---|---|---|---|---|---|
| | 11A to | 11B to | 11C to | main | br | pobr |
| 1 | 12A | | | 13A | 14B | 16B |
| 2 | 12B | | | 13D | 14C | 16B |
| 3 | 12C | | | 13I | 14A | 16B |
| 4 | | 12A | | 13B | 14B | 16C |
| 5 | | 12B | | 13E | 14C | 16C |
| 6 | | 12C | | 13H | 14A | 16C |
| 7 | | | 12A | 13C | 14B | 16A |
| 8 | | | 12B | 13F | 14C | 16A |
| 9 | | | 12C | 13G | 14A | 16A |

As noted, the 3P3T switching device 10 depicted in FIG. 10 can operate in a second mode in which A equals three so that three of the main switches 13 have the first (ON) state, all three of the poles 11 are active, and all three of the throws 12 are active. If all poles 11 and all throws 12 are active, as in the second mode, then each pole 11 and throw 12 is non-reflective so the bridge switches 14 and pole bridge switches 16 are not needed. In some situations, however, it may be advantageous to change back and forth between the first mode and the second mode. The switching device 10 depicted in FIG. 10 is capable of operating with all poles 11 non-reflective and all throws 12 non-reflective, whether operating in the first mode or in the second mode.

TABLE 5

| | PATHS | | | SWITCHES WITH FIRST (ON) STATE main | | |
|---|---|---|---|---|---|---|
| | 11A to | 11B to | 11C to | | | |
| 1 | 12A | 12B | 12C | 13A | 13E | 13G |
| 2 | 12B | 12C | 12A | 13D | 13H | 13C |
| 3 | 12C | 12A | 12B | 13I | 13B | 13F |

Table 5 indicates the three possible device states for the 3P3T switching device 10 of FIG. 10 when operating in the second mode (not depicted). All poles 11 and throws 12 are active, so all bridge switches 14 and pole bridge switches 16 have the second (OFF) state.

Figure 11:
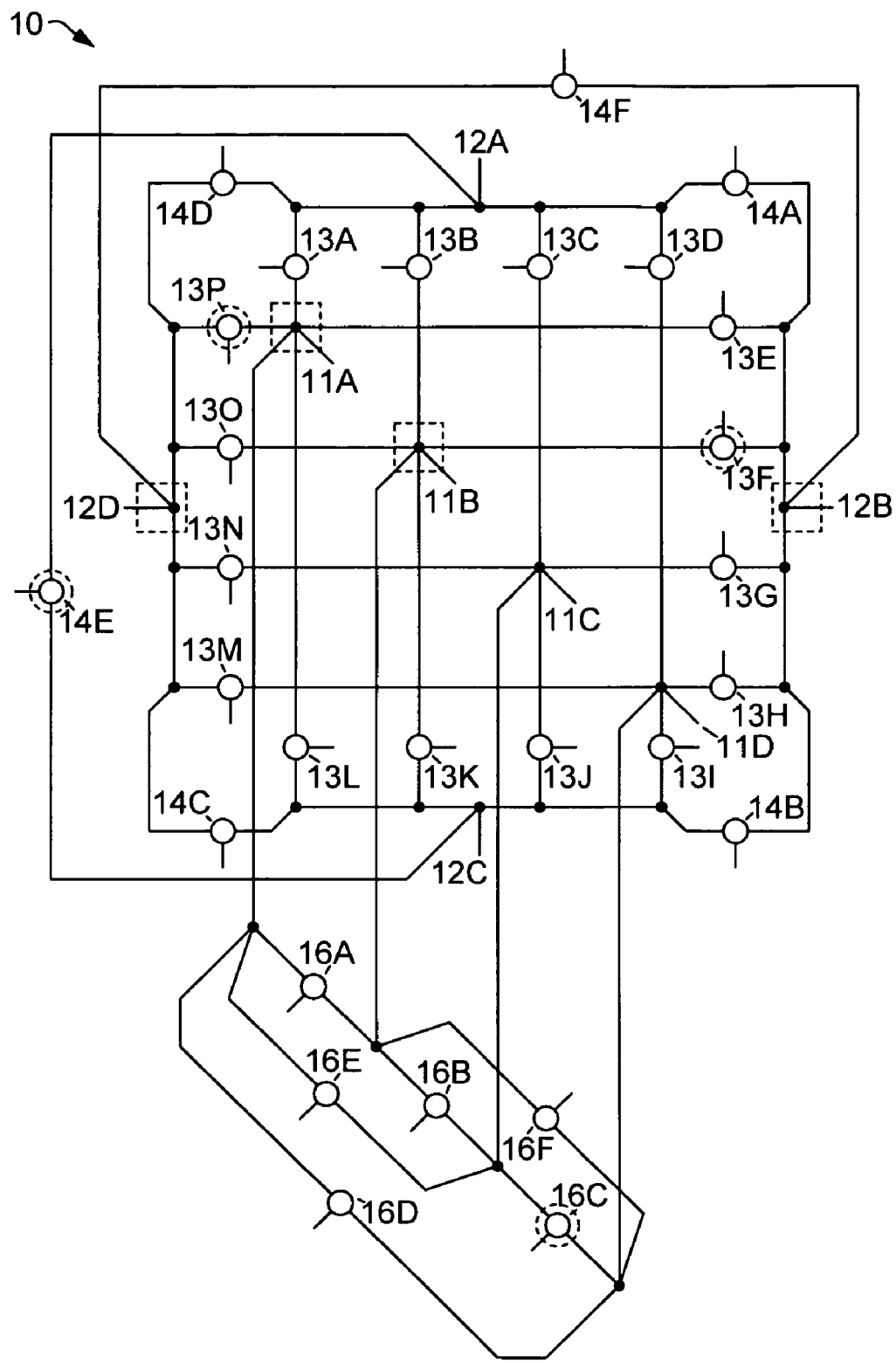
FIG. 11 depicts a non-reflective 4P4T switching device comprising four poles, four throws, sixteen main switches, six bridge switches, and six pole bridge switches.

FIG. 11 depicts a non-reflective 4P4T switching device 10 comprising four poles 11, four throws 12, sixteen main switches 13, six bridge switches 14, and six pole bridge switches 16, in accordance with an embodiment. The embodiment of FIG. 11 is similar to that of FIG. 10. The 4P4T switching device 10 of FIG. 11 can operate in a first mode or a second mode. In the first mode, A equals two so two of the main switches 13 have the first (ON) state, two of the four poles 11 are active, and two of the four throws 12 are active. In the second mode, A equals four so four of the main switches 13 have the first (ON) state, all four of the poles 11 are active, and all four of the throws 12 are active. In the device state depicted in FIG. 11, poles 11A and 11B are active and throws 12B and 12D are active; this device state is an example of the first mode. In this device state, pole bridge switch 16C has the first (ON) state and is connected to non-active poles 11C and 11D. Bridge switch 14E has the first (ON) state and is connected to non-active poles 12A and 12C.

Figure 12:
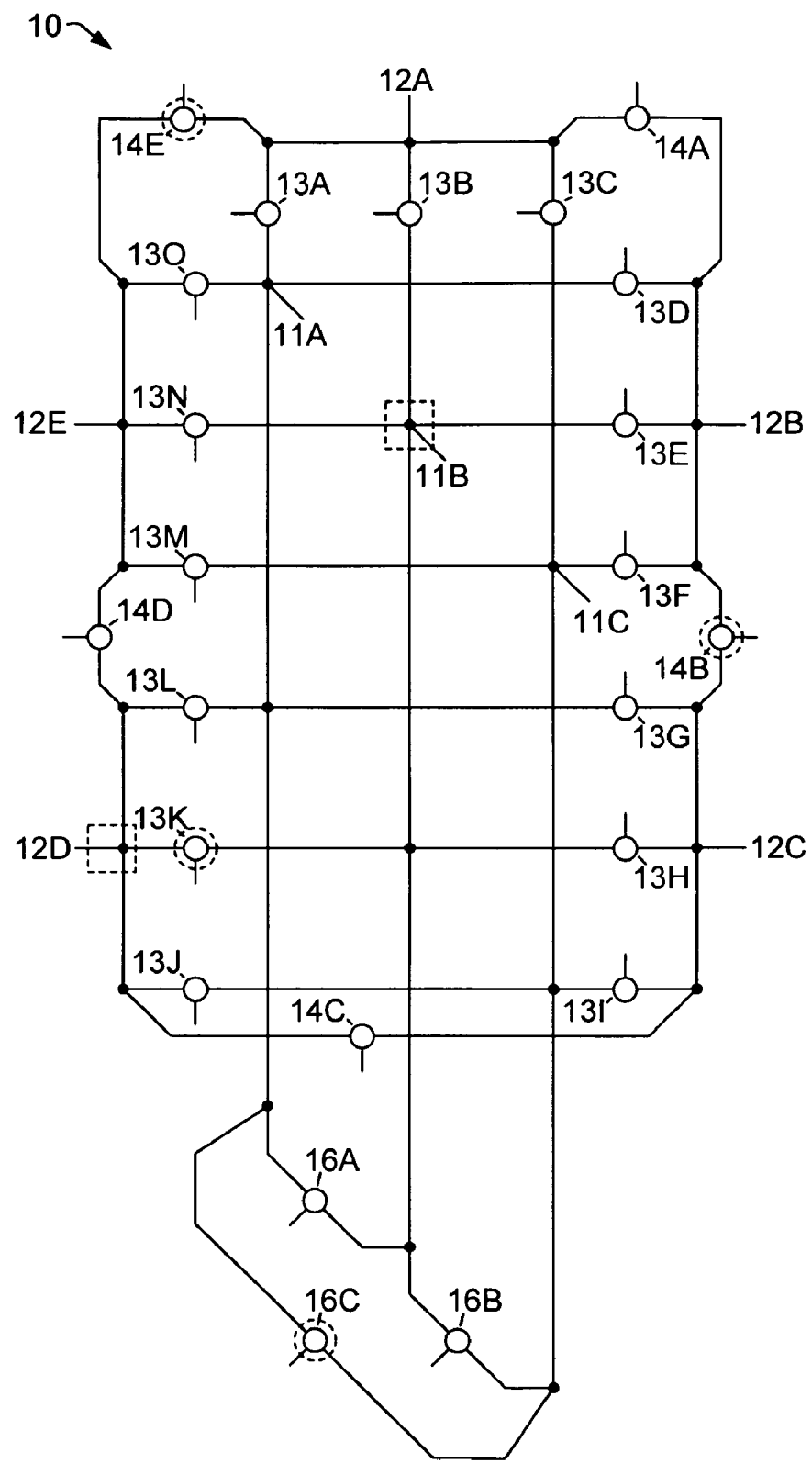
FIG. 12 depicts a non-reflective 3P5T switching device comprising three poles, five throws, fifteen main switches, five bridge switches, and three pole bridge switches.

FIG. 12 depicts a non-reflective 3P5T switching device 10 comprising three poles 11, five throws 12, fifteen main switches 13, five bridge switches 14, and three pole bridge switches 16, in accordance with an embodiment. The embodiment of FIG. 12 is similar to those of FIGS. 10-11. The switching device 10 of FIG. 12 can operate in a first mode in which A equals one, as depicted in FIG. 12. In the depicted device state, pole 11B is active and throw 12D is active. Pole bridge switch 16C has the first (ON) state and is connected to non-active poles 11A and 11C. Bridge switches 14B and 14E have the first (ON) state and are connected to non-active throws 12A, 12B, 12C, and 12E.

TABLE 6

|  | Figure | |
| --- | --- | --- |
|  | FIG. 12 | FIG. 4 |
| A (active count) | 1 | 3 |
| bridge switches | 5 | 10 |
| pole bridge switches | 3 | — |

Table 6 compares the 3P5T embodiment of FIG. 12 and the 3P5T embodiment of FIG. 4. The count A equals one in the embodiment of FIG. 12 and three in the embodiment of FIG. 4. In another embodiment, a switching device 10 could include ten bridge switches 14 as in the embodiment of FIG. 4 and also three pole bridge switches 16 as in the embodiment of FIG. 12. Such an embodiment could operate in a first mode with A equal to one or in a second mode with A equal to three, and it would be possible to change back and forth between the first and second modes.

The number of bridge switches 14 and pole bridge switches 16 needed for minimizing reflectivity depends upon the value of A, rather than the value of M, for the embodiments of FIGS. 10-12. Recall that in the embodiments of FIGS. 1-9, each throw 12 is connected to at least M+1 bridge switches 14 and the bridge switch count B is greater than or equal to N(M+1)/2. In the embodiments of FIGS. 1-9, all poles 11 are active so A equals M, but A is less than N.

In the embodiments of FIGS. 10-12, in contrast, A may be less than or equal to both M and N. If A is less than M, then each pole 11 should be connected to at least A+1 pole bridge switches 16, and the pole bridge switch count P should be greater than or equal to M(A+1)/2. If A is less than N, then each throw 12 should be connected to at least A+1 bridge switches 14, and the bridge switch count B should be greater than or equal to N(A+1)/2. If A is equal to both M and N, then no bridge switches 14 or pole bridge switches 16 are needed for non-reflectivity.

If the switching device 10 is to be capable of operating in several modes with different values of A, then the number of connected bridge switches 14 and the number of connected pole bridge switches 16, determined as in the preceding paragraph, should be large enough for non-reflective operation in each of the several modes. If the number of connected bridge switches 14 or connected pole bridge switches 16 is greater than the minimum needed in a given mode, then the extra switches are set to the second (OFF) state. Additional embodiments similar to those of FIGS. 10-12 are possible, such embodiments having greater values of M and N. For example, a 5P5T switching device 10 that includes bridge switches 14 and pole bridge switches 16 may be operated with A equal to one, three, or five.

Figure 13:
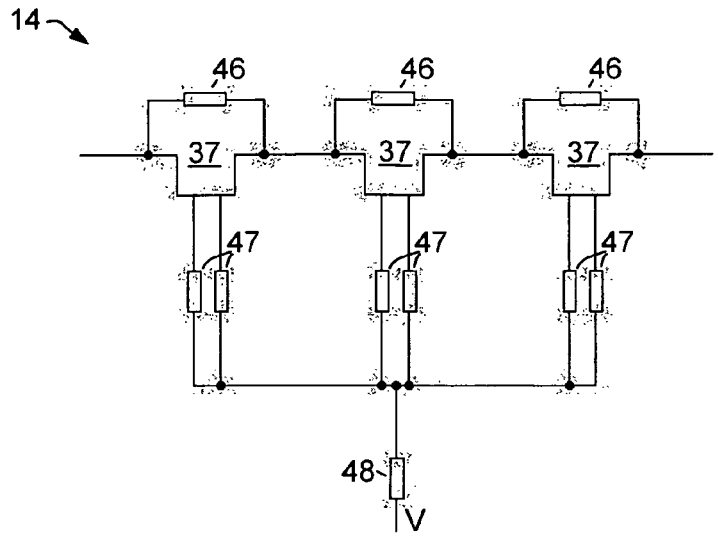
FIG. 13 depicts a bridge switch having a series-only configuration.
Figure 14:
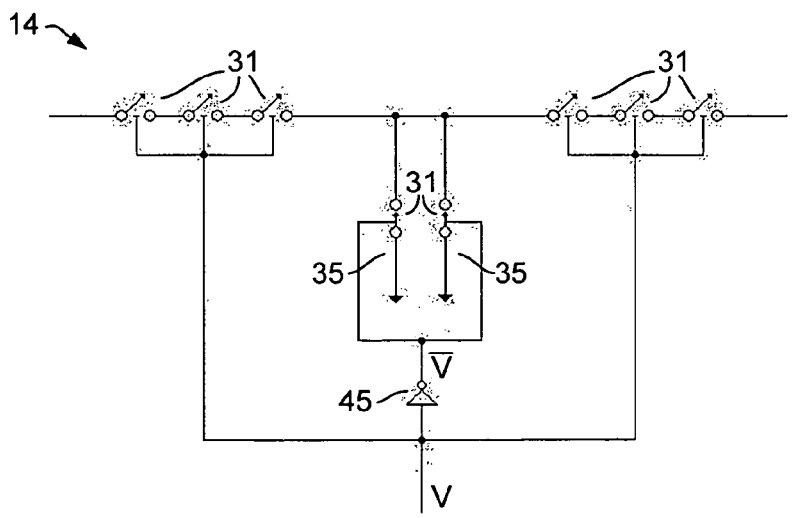
FIG. 14 depicts a bridge switch having a series-shunt-series configuration.
Figure 15:
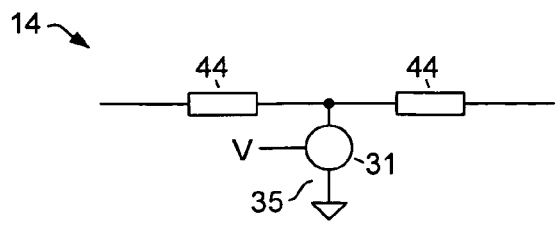
FIG. 15 depicts a bridge switch that includes a pair of transmission lines flanking a variable shunt.

The main switches 13, bridge switches 14, and pole bridge switches 16 for the embodiments described herein may be realized in a variety of ways. Each type of switch may be realized using series switching elements or variable shunt elements or a configuration that combines series switching elements and variable shunt elements. Switches may be realized using these configurations: series-only, series-shunt-series, or variable shunt combined with transmission lines. FIGS. 13-15 depict examples of bridge switches 14, but the depicted configurations may be used for other types of switches as well. Within a switching device 10, different configurations may be used for individual main switches 13, bridge switches 14, and pole bridge switches 16. Termination switches 15, described in connection with FIGS. 16 and 17, may be realized using similar configurations. In other embodiments, a main switch 13 or bridge switch 14 may include additional circuit elements such as a resistor, capacitor, or inductor, or an additional circuit element such as a capacitor may be connected in series between a main switch 13 or bridge switch 14 and a pole 11 or throw 12.

FIG. 13 depicts a bridge switch 14 having a series-only configuration, in accordance with an embodiment. The bridge switch 14 includes three series switching elements, each comprising a dual-gate field effect transistor (FET) 37 connected to a source-drain resistor 46. Each dual-gate FET 37 receives a control signal V through a pair of gate resistors 47 which are connected to a resistor 48.

FIG. 14 depicts a bridge switch 14 having a series-shunt-series configuration, in accordance with an embodiment. The bridge switch 14 includes a first set of series switching elements 31, a set of variable shunt elements 35, a second set of series switching elements 31, and an inverter 45. Each variable shunt element 35 includes a switching element 31 coupled to a reference potential, which is this embodiment is ground. Each set of series switching elements 31 receives control signal V, and variable shunt elements 35 receive from inverter 45 the complement of control signal V. Compared to the embodiment of FIG. 14, the series-only configuration of FIG. 13 may provide higher isolation at lower frequency and higher power handling, but with the cost of more insertion loss. The configuration of FIG. 14 uses variable shunt elements 35 to provide high isolation, but with the cost of a more complex circuit with more components.

FIG. 15 depicts a bridge switch 14 that includes a pair of transmission lines 44 flanking a variable shunt 35, in accordance with an embodiment. The embodiment of FIG. 15 is especially useful at high frequency, such as frequencies above 1 GHz. Each transmission line 44 has a length that equals approximately one-quarter of the wavelength for the frequency band of the signal that is conducted by the transmission line 44. Within variable shunt 35, switching element 31 receives a control signal V. Control signal V turns off switching element 31 when bridge switch 14 has the first (ON) state.

Embodiments described herein may be implemented as integrated circuits or using discrete components. The several types of switches (main switches 13, bridge switches 14, pole bridge switches 16, termination switches 15) may be implemented as semiconductor switching elements such as diodes or PIN diodes or bipolar transistors or field effect transistors (FET). For example, switching elements may be implemented as silicon based (Si-based) FETs or as gallium arsenide based (GaAs-based) FETs. Si-based FETs include silicon junction FET (JFET), silicon metal-semiconductor FET (MESFET), silicon germanium bipolar CMOS (SiGe BiCMOS), and various types of silicon metal-oxide-semiconductor FET (MOSFET) such as NMOS, CMOS, silicon on sapphire (SOS), and silicon on insulator (SOI). GaAs-based FETs include GaAs JFET, GaAs MESFET, GaAs pseudomorphic high electron mobility transistor (pHEMT), GaAs metamorphic high electron mobility transistor (mHEMT), and GaAs heterostructure FET (HFET).

Tables 7-14 present the results of simulating two circuit designs. Each of the simulated designs is for a 2P4T (also called DP4T) switching device. One of the simulated designs (NON-REFLECT) is the 2P4T switching device 10 that is depicted in FIGS. 1 and 2, with each main switch 13 and bridge switch 14 realized using the series-only FET configuration depicted in FIG. 13. The other simulated design (REFLECT) is a 2P4T design in which bridge switches 14 are absent and there is no conductor or other connector between individual throws 12. In the REFLECT design, the poles 11, throws 12, and main switches 13 are connected as in FIGS. 1 and 2 and each main switch 13 is realized using the series-only FET configuration depicted in FIG. 13.

Each simulation assumes that there are two conductive (ON) signal paths, 11A-12A and 11B-12B. This device state corresponds to row 1 in Table 1. Tables 7-12 present the return loss values for a range of frequencies for individual poles 11 or throws 12. The simulation results for the NON-REFLECT design show very low return loss values throughout a frequency range from DC to 6 GHz. The return loss values are approximately negative 18 to negative 24 dB for each of the poles 11A-11B and for each of the throws 12A-12D. The non-active throws 12C and 12D show return loss values that are as low as the values for the active throws 12A and 12B. In contrast, the simulation results for the REFLECT design show very high return loss for the non-active throws 12C and 12D. For non-active throws 12C and 12D, the return loss values are negative 0.5 dB or higher in the frequency range from DC to 6 GHz.

The simulation results of Tables 7-12 demonstrate that embodiments described in this application provide a practical way to make a non-reflective MPNT switching device with low return loss throughout a wide frequency range, including microwave frequencies up to at least 6 GHz.

TABLE 7

| frequency (GHz) | REFLECT return loss (dB) pole 11A | NON-REFLECT return loss (dB) pole 11A |
|---|---|---|
| 0.2 | −20.0 | −20.6 |
| 1.0 | −19.5 | −20.7 |
| 2.0 | −17.8 | −19.7 |
| 3.0 | −16.1 | −18.7 |
| 4.0 | −14.7 | −18.1 |
| 5.0 | −13.5 | −18.0 |
| 6.0 | −12.9 | −18.5 |

TABLE 8

| frequency (GHz) | REFLECT return loss (dB) pole 11B | NON-REFLECT return loss (dB) pole 11B |
|---|---|---|
| 0.2 | −20.0 | −20.5 |
| 1.0 | −19.5 | −20.7 |
| 2.0 | −17.8 | −19.7 |
| 3.0 | −16.1 | −18.7 |
| 4.0 | −14.7 | −18.1 |
| 5.0 | −13.5 | −18.0 |
| 6.0 | −12.9 | −18.5 |

TABLE 9

| frequency (GHz) | REFLECT return loss (dB) throw 12A | NON-REFLECT return loss (dB) throw 12A |
|---|---|---|
| 0.2 | −19.7 | −20.5 |
| 1.0 | −19.0 | −21.0 |
| 2.0 | −17.0 | −20.1 |
| 3.0 | −15.0 | −19.3 |
| 4.0 | −13.5 | −18.9 |
| 5.0 | −12.2 | −19.1 |
| 6.0 | −11.5 | −20.0 |

TABLE 10

| frequency (GHz) | REFLECT return loss (dB) throw 12B | NON-REFLECT return loss (dB) throw 12B |
|---|---|---|
| 0.2 | −19.7 | −20.5 |
| 1.0 | −19.0 | −21.0 |
| 2.0 | −17.0 | −20.2 |
| 3.0 | −15.0 | −19.3 |
| 4.0 | −13.5 | −18.9 |
| 5.0 | −12.2 | −19.1 |
| 6.0 | −11.5 | −20.0 |

TABLE 11

| frequency (GHz) | REFLECT return loss (dB) throw 12C | NON-REFLECT return loss (dB) throw 12C |
|---|---|---|
| 0.2 | −0.2 | −20.6 |
| 1.0 | −0.3 | −21.4 |
| 2.0 | −0.3 | −20.9 |
| 3.0 | −0.3 | −20.5 |
| 4.0 | −0.4 | −20.6 |
| 5.0 | −0.4 | −21.7 |
| 6.0 | −0.5 | −23.8 |

TABLE 12

| frequency (GHz) | REFLECT return loss (dB) throw 12D | NON-REFLECT return loss (dB) throw 12D |
|---|---|---|
| 0.2 | −0.2 | −20.6 |
| 1.0 | −0.3 | −21.4 |
| 2.0 | −0.3 | −20.9 |
| 3.0 | −0.3 | −20.5 |
| 4.0 | −0.4 | −20.6 |
| 5.0 | −0.4 | −21.6 |
| 6.0 | −0.5 | −23.8 |

Inclusion of bridge switches 14, as in the NON-REFLECT design, causes only modest changes in insertion loss and isolation. Tables 13-14 present the simulation results for insertion loss and isolation for a range of frequencies for selected signal paths. As noted above, there are two conductive (ON) signal paths, 11A-12A and 11B-12B. In the conductive signal path 11B-12B, insertion loss is a little larger in the NON-REFLECT design than in the REFLECT design. In the non-conductive signal path 11B-12D, isolation is somewhat less in the NON-REFLECT design than in the REFLECT design.

TABLE 13

| frequency (GHz) | REFLECT insertion loss (dB) 11B-12B | NON-REFLECT insertion loss (dB) 11B-12B |
|---|---|---|
| 0.2 | −1.4 | −1.4 |
| 1.0 | −1.4 | −1.5 |
| 2.0 | −1.4 | −1.6 |
| 3.0 | −1.5 | −1.6 |
| 4.0 | −1.6 | −1.7 |
| 5.0 | −1.6 | −1.8 |
| 6.0 | −1.7 | −1.9 |

TABLE 14

| frequency (GHz) | REFLECT isolation (dB) 11B-12D | NON-REFLECT isolation (dB) 11B-12D |
|---|---|---|
| 0.2 | −57 | −53 |
| 1.0 | −38 | −33 |
| 2.0 | −31 | −27 |
| 3.0 | −28 | −22 |
| 4.0 | −25 | −20 |
| 5.0 | −23 | −18 |
| 6.0 | −21 | −16 |

Bridge switches 14 and/or pole bridge switches 16 are used for non-reflectivity in the embodiments of FIGS. 1-12. An alternative method of making a non-reflective switching device is to incorporate at each terminal (a throw 11 or pole 12) a switched termination that provides a matched impedance. Typically a 50 Ohm termination is used in microwave systems and a 75 Ohm termination is used in television transmission systems. The switched termination may be either a series termination or a shunt termination; use of a series termination may result in greater insertion loss. A shunt termination typically includes a resistor coupled between a switching element and a reference potential such as ground. In semiconductor switches using materials such as gallium arsenide (GaAs) with positive control voltages, a shunt termination may also include a capacitor.

Figure 16:
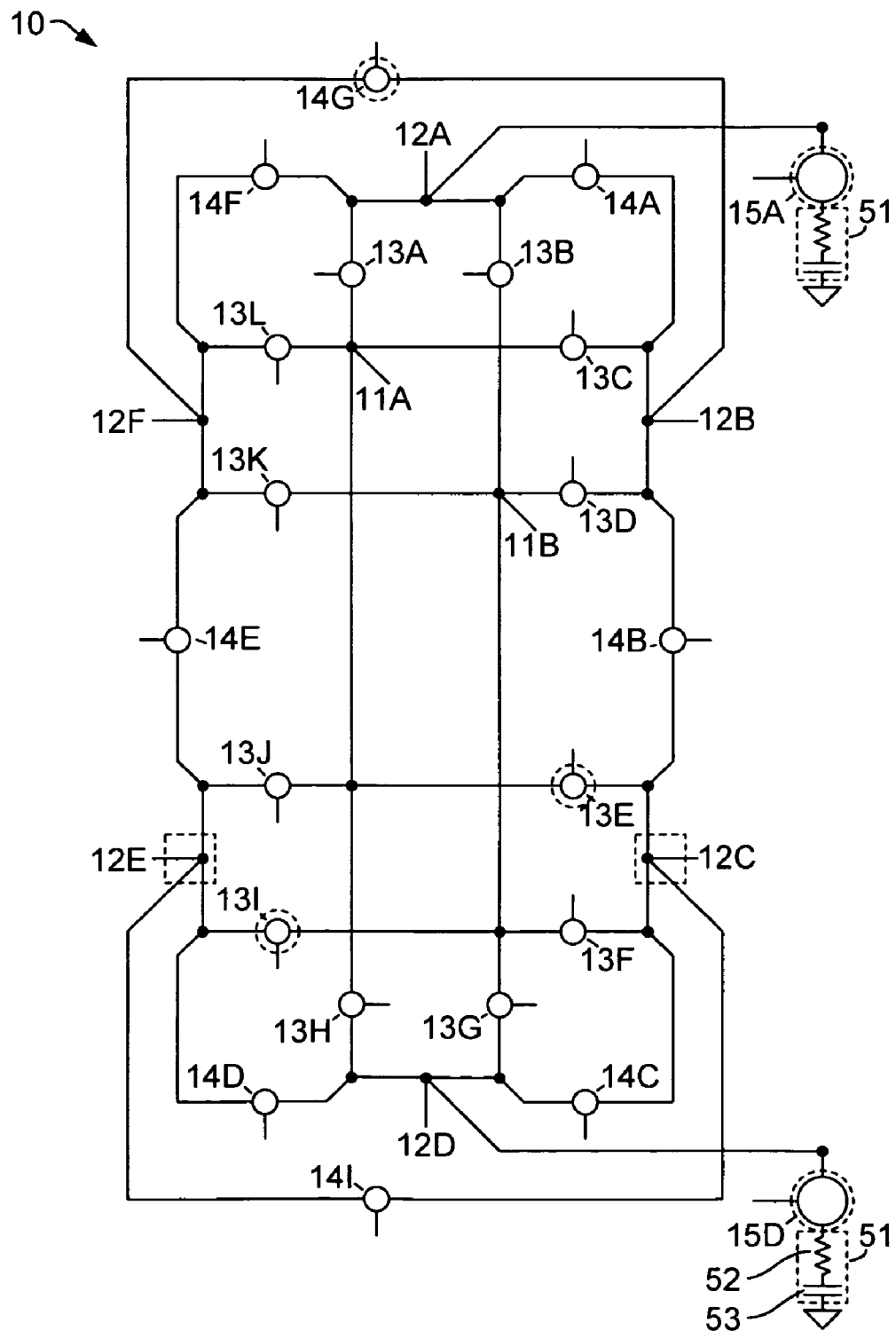
FIG. 16 depicts a non-reflective 2P6T switching device comprising eight bridge switches, two terminations, and two termination switches.
Figure 17:
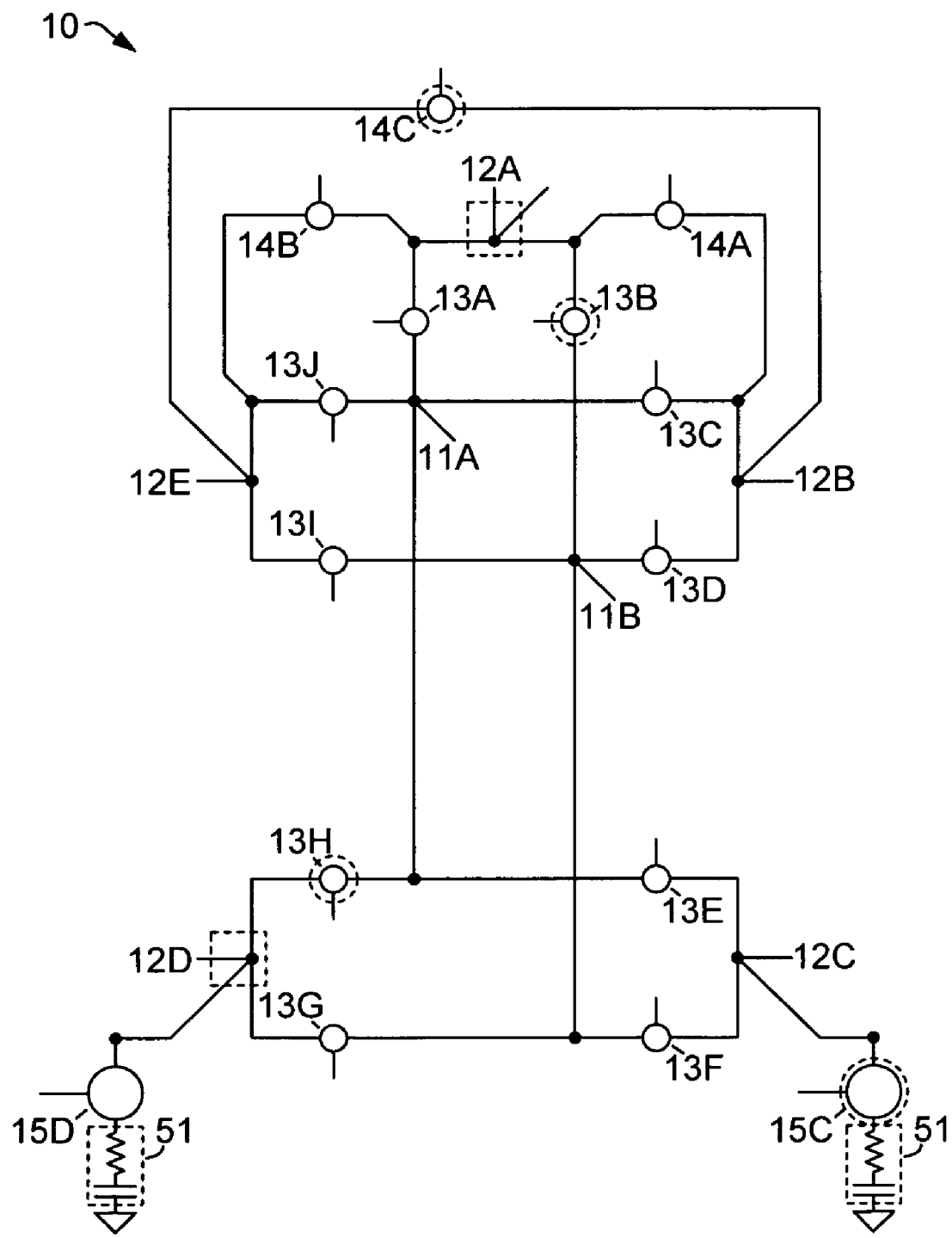
FIG. 17 depicts a non-reflective 2P5T switching device comprising three bridge switches, two terminations, and two termination switches.

FIGS. 16 and 17 depict embodiments that use a combination of bridge switches 14 and terminations 51 for non-reflectivity. FIG. 16 depicts a non-reflective 2P6T switching device 10 comprising two poles 11, six throws 12, twelve main switches 13, eight bridge switches 14, two terminations 51, and two termination switches 15, in accordance with an embodiment. The embodiment of FIG. 16 is similar to that of FIG. 3, with two differences: (1) removal of one bridge switch 14H; and (2) addition of terminations 51 operably coupled to throws 12A and 12D through termination switches 15A and 15D. In this description and in the appended claims, a termination switch 15 is a switch coupled to a termination 51, and use of the adjective "termination" does not imply any special attributes for a termination switch 15. Each termination 51 includes a resistor 52 and a capacitor 53, as indicated by reference numerals in the termination 51 that is connected to termination switch 15D.

In the embodiment of FIG. 16, each of throws 12A and 12D is connected to only two bridge switches 14. In other words, throws 12A and 12D are not connected to at least M+1 bridge switches 14. In contrast, a majority of the throws 12 are connected to at least M+1 bridge switches 14, similar to the throws 12 in the embodiments of FIGS. 1-12. Thus, each of throws 12B, 12C, 12E, and 12F is connected to three (M+1) bridge switches 14. With respect to the embodiment of FIG. 16, we use the adjective "fully-bridged" to indicate throws 12 that are connected to at least M+1 bridge switches 14 and to distinguish the fully-bridged throws 12 from throws 12 that are connected to fewer than M+1 bridge switches 14. It is understood that a fully-bridged throw 12 corresponds to an ordinary throw 12 that is connected to at least M+1 bridge switches 14 as described in connection with FIGS. 1-12.

The possible device states for the embodiment of FIG. 16 are similar to the thirty possible device states indicated in Table 2 for the 2P6T switching device 10 of FIG. 3, but with a few differences for certain states. As noted above, the embodiment of FIG. 16 differs from that of FIG. 3 in the removal of bridge switch 14H and the addition of terminations 51 operably coupled to throws 12A and 12D through termination switches 15A and 15D. In Table 2, bridge switch 14H has the first (ON) state in the device states which correspond to rows 9, 11, 24, and 26. For the embodiment of FIG. 16, these four device states are modified as indicated in Table 15. All other device states are the same as those indicated in Table 2. The abbreviations "br" and "term" refer to bridge switches 14 and termination switches 15 respectively. The device state depicted in FIG. 16 corresponds to row 11 in Table 15.

TABLE 15

| | PATHS | | SWITCHES WITH | | | |
|---|---|---|---|---|---|---|
| | 11A to | 11B to | FIRST (ON) STATE | | | |
| | | | main | br | | term |
| 9 | 12B | 12F | 13C | 13K | 14I | 15A 15D |
| 11 | 12C | 12E | 13E | 13I | 14G | 15A 15D |
| 24 | 12F | 12B | 13L | 13D | 14I | 15A 15D |
| 26 | 12E | 12C | 13J | 13F | 14G | 15A 15D |

FIG. 17 depicts a non-reflective 2P5T switching device comprising two poles 11, five throws 12, ten main switches 13, three bridge switches 14, two terminations 51, and two termination switches 15, in accordance with an embodiment. Throws 12C and 12D are operably coupled to terminations 51 through termination switches 15C and 15D. In the embodiment of FIG. 17, each of throws 12C and 12D is connected to zero bridge switches 14. In contrast, a majority of the throws 12 are connected to at least two bridge switches 14. Thus, each of throws 12A, 12B, and 12E is connected to two bridge switches 14. With respect to the embodiment of FIG. 17, we use the adjective "semi-bridged" to indicate throws 12 that are connected to at least two bridge switches 14 and the adjective "unbridged" to indicate throws 12 that are connected to zero bridge switches 14. The semi-bridged throw count S (number of semi-bridged throws 12) is three. The bridge switch count B is three, and this value is greater than or equal to the semi-bridged throw count S.

In each device state for the embodiment of FIG. 17, one semi-bridged throw 12 is active and one unbridged throw 12 is active. Table 16 depicts the twelve possible device states for the embodiment of FIG. 17. The abbreviations "br" and "term" refer to bridge switches 14 and termination switches 15 respectively. The device state depicted in FIG. 17 corresponds to row 8 in Table 16.

TABLE 16

| | PATHS | | SWITCHES WITH | | |
|---|---|---|---|---|---|
| | 11A to | 11B to | FIRST (ON) STATE | | |
| | | | main | br | term |
| 1 | 12A | 12C | 13A | 13F | 14C | 15D |
| 2 | 12A | 12D | 13A | 13G | 14C | 15C |

TABLE 16-continued

| PATHS | | SWITCHES WITH | | | |
|---|---|---|---|---|---|
| 11A | 11B | FIRST (ON) STATE | | | |
| to | to | main | br | | term |
| 3 | 12B | 12C | 13C | 13F | 14B | 15D |
| 4 | 12B | 12D | 13C | 13G | 14B | 15C |
| 5 | 12E | 12C | 13J | 13F | 14A | 15D |
| 6 | 12E | 12D | 13J | 13G | 14A | 15C |
| 7 | 12C | 12A | 13E | 13B | 14C | 15D |
| 8 | 12D | 12A | 13H | 13B | 14C | 15C |
| 9 | 12C | 12B | 13E | 13D | 14B | 15D |
| 10 | 12D | 12B | 13H | 13D | 14B | 15C |
| 11 | 12C | 12E | 13E | 13I | 14A | 15D |
| 12 | 12D | 12E | 13H | 13I | 14A | 15C |

For some applications, it may be acceptable for one or more terminal (pole 11 or throw 12) to be reflective. For such applications, one may use a switching device 10 in which a majority of the terminals are non-reflective and a minority of the terminals are reflective. For example, one could use a switching device 10 that is similar to the embodiments of FIG. 16 or FIG. 17 but which omits the terminations 51 and the termination switches 15. In such an embodiment (not depicted), a majority of the throws 12 are connected to bridge switches 14, either at least M+1 bridge switches 14 as in FIG. 16 or at least two bridge switches 14 as in FIG. 17. A minority of the throws 12 have no connected bridge switches 14 and no connected termination 51 or termination switch 15. The minority of reflective throws 12 are likely to have lower insertion loss and higher isolation when compared to a throw 12 that is connected to bridge switches 14 or a termination 51. Within a switching device 10, non-reflectivity may be a high priority for some of the terminals, while low insertion loss or high isolation may be a high priority for other terminals.

Although we have described in detail various embodiments, other embodiments and modifications will be apparent to those of skill in the art in light of this text and accompanying drawings. The following claims are intended to include all such embodiments, modifications and equivalents.

What is claimed is:

1. A switching device comprising:
   at least two poles;
   at least four throws, a throw count N being greater than a pole count M, wherein a difference between the throw count N and the pole count M equals an even integer that is greater than or equal to two;
   a plurality of main switches, a main switch count equaling the pole count M multiplied by the throw count N, each main switch being connected between one of the poles and one of the throws, wherein each of the poles is operably coupled to each of the throws through one of the main switches; and
   a plurality of bridge switches, each bridge switch being connected between two of the throws, wherein each throw is connected to at least M+1 of the bridge switches, and wherein a bridge switch count B is greater than or equal to N(M+1)/2.

2. The switching device of claim 1,
   wherein each throw is connected to M+1 of the bridge switches, and wherein the bridge switch count B equals N(M+1)/2.

3. The switching device of claim 2,
   wherein each of M of the main switches has a first state and each other main switch has a second state; wherein each pole is connected to one of the M main switches that has the first state; wherein each of the M main switches that has the first state is connected to one of M active throws, each of the active throws being one of the N throws;
   wherein for each active throw each of the bridge switches that is connected to the active throw has the second state; and
   wherein for each non-active throw one of the bridge switches that is connected to the non-active throw has the first state and each other bridge switch that is connected to the non-active throw has the second state, each non-active throw being one of the throws that is not one of the active throws.

4. The switching device of claim 2,
   wherein for each throw the M+1 bridge switches that are connected to the throw include two basic bridge switches and M−1 augment bridge switches.

5. The switching device of claim 2,
   wherein the at least four throws comprise at least six throws, wherein the difference between the throw count N and the pole count M equals an even integer that is greater than or equal to four, and
   wherein for each throw the M+1 bridge switches that are connected to the throw include one basic bridge switch and M augment bridge switches.

6. The switching device of claim 2,
   wherein the at least four throws comprise at least six throws, wherein the difference between the throw count N and the pole count M equals an even integer that is greater than or equal to four, and
   wherein for each throw the M+1 bridge switches that are connected to the throw include M+1 augment bridge switches.

7. The switching device of claim 2,
   wherein the at least four throws comprise at least six throws, wherein the difference between the throw count N and the pole count M equals an even integer that is greater than or equal to four, and
   wherein for each throw the M+1 bridge switches that are connected to the throw include at least one augment bridge switches, and wherein a first augment bridge switch count for a first one of the throws differs from a second augment bridge switch count for a second one of the throws.

8. The switching device of claim 3,
   wherein for each throw the M+1 bridge switches that are connected to the throw include two basic bridge switches and M−1 augment bridge switches.

9. The switching device of claim 3,
   wherein the at least four throws comprise at least six throws, wherein the difference between the throw count N and the pole count M equals an even integer that is greater than or equal to four, and
   wherein for each throw the M+1 bridge switches that are connected to the throw include one basic bridge switch and M augment bridge switches.

10. The switching device of claim 3,
    wherein the at least four throws comprise at least six throws, wherein the difference between the throw count N and the pole count M equals an even integer that is greater than or equal to four, and
    wherein for each throw the M+1 bridge switches that are connected to the throw include M+1 augment bridge switches.

11. The switching device of claim 3,
    wherein the at least four throws comprise at least six throws, wherein the difference between the throw count N and the pole count M equals an even integer that is greater than or equal to four, and wherein for each throw the M+1 bridge switches that are connected to the throw include at least one augment bridge switches, and wherein a first augment bridge switch count for a first one of the throws differs from a second augment bridge switch count for a second one of the throws.

12. The switching device of claim 1, wherein each of at least two of the throws is connected to greater than M+1 of the bridge switches, and wherein the bridge switch count B is greater than N(M+1)/2.

13. The switching device of claim 12, wherein each of M of the main switches has a first state and each other main switch has a second state; wherein each pole is connected to one of the M main switches that has the first state; wherein each of the M main switches that has the first state is connected to one of M active throws, each of the active throws being one of the N throws;

wherein for each active throw each of the bridge switches that is connected to the active throw has the second state; and wherein for each non-active throw one of the bridge switches that is connected to the non-active throw has the first state and each other bridge switch that is connected to the non-active throw has the second state, each non-active throw being one of the throws that is not one of the active throws.

14. The switching device of claim 12, wherein for each throw the bridge switches that are connected to the throw include two basic bridge switches and at least M−1 augment bridge switches.

15. A switching device comprising:

at least three poles;

at least three throws, a throw count N being greater than or equal to a pole count M, wherein a difference between the throw count N and the pole count M equals an even integer that is greater than or equal to zero;

a plurality of main switches, a main switch count equaling the pole count M multiplied by the throw count N, each main switch being connected between one of the poles and one of the throws, wherein each of the poles is operably coupled to each of the throws through one of the main switches;

a plurality of bridge switches, each bridge switch being connected between two of the throws, wherein each throw is connected to at least two of the bridge switches, and wherein a bridge switch count B is greater than or equal to N; and a plurality of pole bridge switches, each pole bridge switch being connected between two of the poles, wherein each pole is connected to at least two of the pole bridge switches, and wherein a pole bridge switch count P is greater than or equal to M.

16. The switching device of claim 15, wherein each of A of the main switches has a first state and each other main switch has a second state, A being a count for the main switches having the first state; wherein each of the A main switches that has the first state is connected to one of A active poles, each of the active poles being one of the M poles; wherein each of the A main switches that has the first state is connected to one of A active throws, each of the active throws being one of the N throws;

wherein for each active throw each of the bridge switches that is connected to the active throw has the second state;

wherein for each non-active throw one of the bridge switches that is connected to the non-active throw has the first state and each other bridge switch that is connected to the non-active throw has the second state, each non-active throw being one of the throws that is not one of the active throws;

wherein for each active pole each of the pole bridge switches that is connected to the active pole has the second state; and wherein for each non-active pole one of the pole bridge switches that is connected to the non-active pole has the first state and each other pole bridge switch that is connected to the non-active pole has the second state, each non-active pole being one of the poles that is not one of the active poles.

17. The switching device of claim 16, wherein each throw is connected to at least A+1 of the bridge switches; wherein the bridge switch count B is greater than or equal to N(A+1)/2;

wherein each pole is connected to at least A+1 of the pole bridge switches; and wherein the pole bridge switch count P is greater than or equal to M(A+1)/2.

18. A switching device comprising:

at least two poles;

at least six throws, a throw count N being greater than a pole count M, a majority of the throws being fully-bridged throws;

a plurality of main switches, a main switch count equaling the pole count M multiplied by the throw count N, each main switch being connected between one of the poles and one of the throws, wherein each of the poles is operably coupled to each of the throws through one of the main switches; and a plurality of bridge switches, each bridge switch being connected between two of the throws, wherein each fully-bridged throw is connected to at least M+1 of the bridge switches.

19. The switching device of claim 18, wherein each throw that is not a fully-bridged throw is operably coupled to a termination through a termination switch.

20. A switching device comprising:

at least two poles;

at least five throws, a throw count N being greater than a pole count M, a majority of the throws being semi-bridged throws;

a plurality of main switches, a main switch count equaling the pole count M multiplied by the throw count N, each main switch being connected between one of the poles and one of the throws, wherein each of the poles is operably coupled to each of the throws through one of the main switches; and a plurality of bridge switches, each bridge switch being connected between two of the throws, wherein each semi-bridged throw is connected to at least two of the bridge switches, and wherein a bridge switch count B is greater than or equal to a semi-bridged throw count S.

21. The switching device of claim 20, wherein each throw that is not a semi-bridged throw is operably coupled to a termination through a termination switch.

* * * * *